(12) United States Patent
Hatakeyama et al.

(10) Patent No.: US 7,189,493 B2
(45) Date of Patent: Mar. 13, 2007

(54) POLYMER, POSITIVE RESIST COMPOSITION, AND PATTERNING PROCESS USING THE SAME

(75) Inventors: Jun Hatakeyama, Niigata (JP); Yuji Harada, Niigata (JP); Yoshio Kawai, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/945,397

(22) Filed: Sep. 21, 2004

(65) Prior Publication Data

US 2005/0079440 A1    Apr. 14, 2005

(30) Foreign Application Priority Data

Oct. 8, 2003   (JP) ............................. 2003-350144

(51) Int. Cl.
G03C 1/73   (2006.01)
G03F 7/039  (2006.01)
G03F 7/20   (2006.01)
G03F 7/30   (2006.01)

(52) U.S. Cl. .................. 430/270.1; 430/910; 430/326; 526/282; 526/268; 526/256; 526/266; 526/270

(58) Field of Classification Search ............ 430/270.1, 430/905, 910, 907; 526/281, 282
See application file for complete search history.

(56) References Cited

U.S. PATENT DOCUMENTS

| 6,448,420 B1 * | 9/2002 | Kinsho et al. ............... 552/549 |
| 2003/0194640 A1 * | 10/2003 | Sato ........................ 430/270.1 |
| 2004/0175645 A1 * | 9/2004 | Sasaki et al. ............. 430/270.1 |
| 2005/0026073 A1 * | 2/2005 | Sasaki ..................... 430/270.1 |

FOREIGN PATENT DOCUMENTS

| JP | A 63-27829 | 2/1988 |
| JP | B2 2-27660 | 6/1990 |
| JP | A 9-73173 | 3/1997 |
| JP | A 9-90637 | 4/1997 |
| JP | A 9-230595 | 9/1997 |
| JP | A 10-10739 | 1/1998 |
| JP | A 2000-26446 | 1/2000 |
| JP | A 2000-159758 | 6/2000 |
| JP | A 2000-327633 | 11/2000 |
| WO | WO 97/33198 | 9/1997 |

OTHER PUBLICATIONS

Ito et al., "Dissolution/Swelling Behavior of Cycloolefin Polymers in Aqueous Base," *SPIE*, vol. 3999, pp. 2-12 (2000).

Ito et al., "Fluoropolymer Resists: Progress and Properties," *Journal of Photopolymer Science and Technology*, vol. 16, No. 4, pp. 523-536 (Jun. 5, 2003).

* cited by examiner

Primary Examiner—Sin Lee
(74) Attorney, Agent, or Firm—Oliff & Berridge, PLC

(57) ABSTRACT

There is disclosed a polymer which at least has the repeating unit represented by the following general formula (1a), and the repeating unit represented by the following general formula (1b) and/or the repeating unit represented by the following general formula (1c), and a positive resist composition comprising the polymer as a base resin. There can be provided a positive resist composition having high sensitivity and high resolution on exposure to a high energy beam, wherein line edge roughness is reduced since swelling at the time of development is suppressed, and the residue after development is little

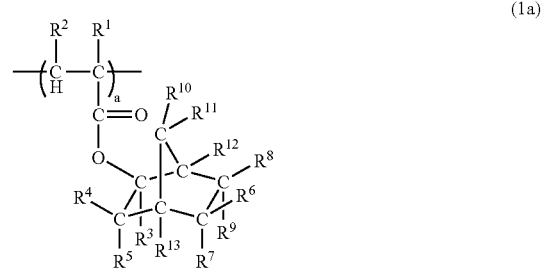

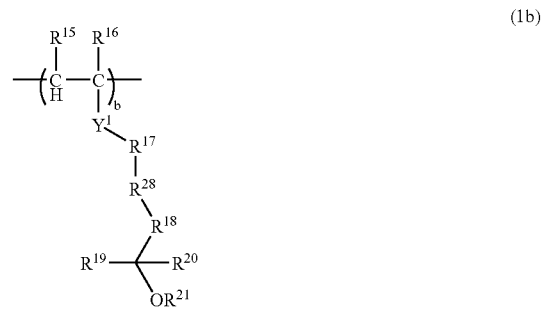

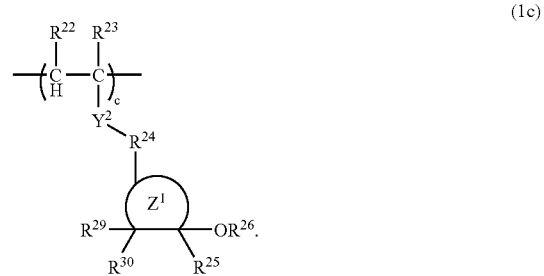

20 Claims, 2 Drawing Sheets F I G. 1
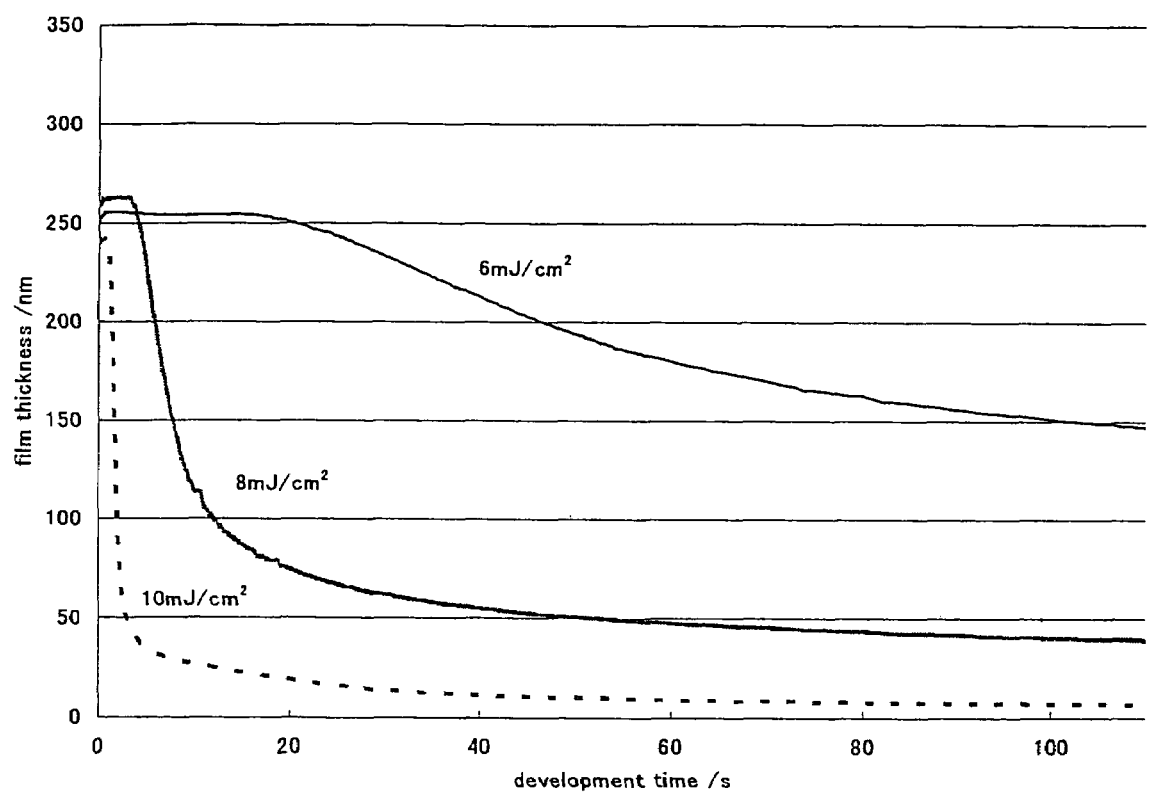

POLYMER, POSITIVE RESIST COMPOSITION, AND PATTERNING PROCESS USING THE SAME

BACKGROUND OF THE INVENTION

1. Field of the Invention

The present invention relates to a positive resist composition, especially to a chemically amplified positive resist composition, suitable as a micropatterning material, especially for the VLSI manufacture, or photomask patterning, which has a high alkaline dissolution-rate contrast before and after exposure, high sensitivity, high resolution, reduced line edge roughness, and an improved etch resistance on exposure to a high energy beam.

2. Description of the Related Art

In recent years, the higher the circuit density and speed of LSI becomes, the finer a pattern rule becomes rapidly. Increasing the NA of the lens system, improved performance of resist and shift to shorter wavelength results in quick shift to finer patterning. Especially shift to shorter wavelength from I-line radiation (365 nm) to KrF (248 nm) causes a big change, and it comes to mass-produce a device under 0.18 μm rule. The chemically amplified positive resist composition wherein an acid is used as a catalyst (for example, see Japanese Patent Publication No. 2-27660 and Japanese Patent Application Laid-open (KOKAI) No. 63-27829) has an outstanding feature to achieve higher resolution and sensitivity of resist, and thus has become a main resist composition especially for deep-ultraviolet lithography.

The resist composition for KrF excimer lasers has began to be used generally for a 0.3-micron process, and it has also been began to be applied to mass-production under 0.18-micron rule via a 0.25-micron rule. Furthermore, study of a 0.15 micron rule has also been started, and the shift to finer patterning is accelerated increasingly. It is expected that a design rule should be 0.13 μm or less according to a shift to shorter wavelength from KrF excimer lasers to ArF excimer lasers (193 nm). However, it was hard to use novolac and polyvinyl phenol resin which have been used conventionally as a base resin for resist, since it has a quite strong absorption near the wavelength of 193 nm. Then, aliphatic resins such as acrylic resins or cycloolefin resins have been examined to ensure transparency and a desired dry etching resistance (for example, see Japanese Patent Application Laid-open (KOKAI) No. 9-73173, Japanese Patent Application Laid-open (KOKAI) No. 10-10739, Japanese Patent Application Laid-open (KOKAI) No. 9-230595 and International publication No. 97/33198).

Among them, the resist comprising (meth)acrylic based resin with a high resolution has been examined. As (meth)acrylic resin, the combination of the (meth)acrylic derivative which has methyl adamantane ester as an acid labile unit and the (meth)acrylic derivative which has an ester of a lactone ring as an adhesion group has been proposed (for example, see Japanese Patent Application Laid-open (KOKAI) No. 9-90637). Furthermore, norbornyl lactone has been proposed as an adhesion group wherein an etch resistance is enhanced (for example, see Japanese Patent Application Laid-open (KOKAI) No. 2000-26446 and Japanese Patent Application Laid-open (KOKAI) No. 2000-159758).

Reduction of line edge roughness and reduction of residue after development are mentioned as one of the tasks in ArF lithography. Swelling at the time of development is mentioned as one of the causes for line edge roughness. Although polyhydroxy styrene used as a resist for KrF lithography doesn't swell easily since phenol moiety is a weak acidic group and has a moderate aqueous alkaline solubility, the polymer comprising a highly hydrophobic alicyclic group swells easily since it is dissolved with a carboxylic acid with high acidity.

Here, the amount of swelling during development has been reported by measurement of the development characteristics of the resist according to the QCM (Quartz Crystal Microbalance) method (for example, see Proc. SPIE Vol. 3999 p 2 (2000)). Although swelling of the film during development cannot be observed by a conventional optical interference thickness-measurement method, it is possible to observe increase in weight of the film by swelling according to the QCM method, since the weight change of a film is measured electrically. In the non-patenting reference 1, swelling of the ArF resist based on cycloolefin polymer is disclosed. Significant swelling is observed especially in the case that a carboxylic acid is used as an adhesion group.

The present invention has been made in order to solve such problems. The object of the present invention is to provide a positive resist composition having high sensitivity and high resolution on exposure to a high energy beam, wherein line edge roughness is reduced since swelling at the time of development is suppressed, and the amount of the residue after development is small.

SUMMARY OF THE INVENTION

To achieve the above mentioned object, the present invention provides a polymer which at least has the repeating unit represented by the following general formula (1a), and the repeating unit represented by the following general formula (1b) and/or the repeating unit represented by the following general formula (1c).

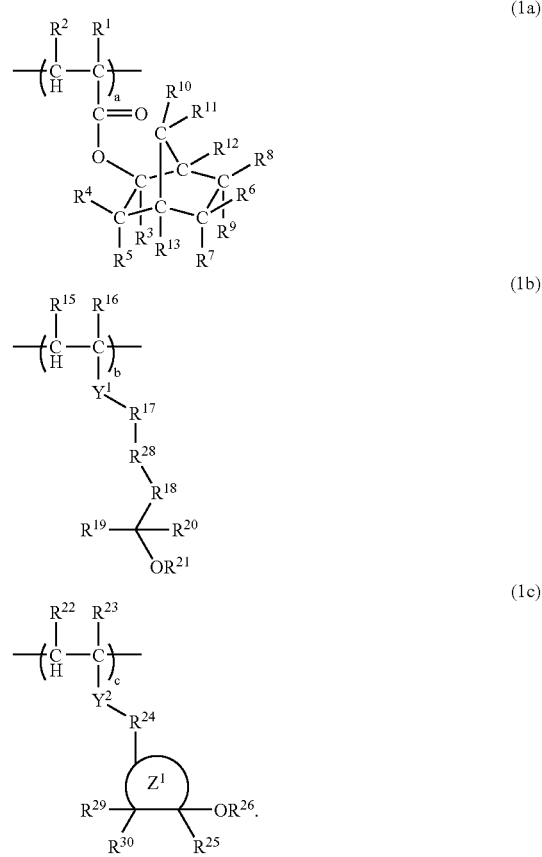

(In the formulae, $R^1$ represents a hydrogen atom, a methyl group or $-CH_2CO_2R^{14}$, $R^2$ represents a hydrogen atom, a methyl group or —$CO_2R^{14}$. $R^3$ represents a linear, branched or cyclic alkyl group having 1–8 carbon atoms or an aryl group having 6–20 carbon atoms which may be substituted. $R^4$ to $R^9$, $R^{12}$ and $R^{13}$ each independently represent a hydrogen atom or a monovalent hydrocarbon group having 1–15 carbon atoms which may contain a hetero atom, and $R^{10}$ and $R^{11}$ represent a hydrogen atom. $R^4$ and $R^5$, $R^6$ and $R^8$, $R^6$ and $R^9$, $R^7$ and $R^9$, $R^7$ and $R^{13}$, $R^8$ and $R^{12}$, $R^{10}$ and $R^{11}$, $R^{11}$ and $R^{12}$ may form a ring together. In that case, they represent a divalent hydrocarbon group having 0.1–15 carbon atoms which may contain a hetero atom. $R^4$ and $R^{13}$, $R^{10}$ and $R^{13}$, $R^6$ and $R^8$ which bond to adjacent carbon atoms may directly bond to each other to form a double bond. $R^{14}$ represents a hydrogen atom, or a linear, branched or cyclic alkyl group having 1–15 carbon atoms. The above-mentioned general formula (1a) also represents an enantiomer. $R^{16}$ and $R^{23}$ represent a hydrogen atom, a methyl group, or —$CH_2CO_2R^{14}$. $R^{15}$ and $R^{22}$ represent a hydrogen atom, a methyl group, or —$CO_2R^{14}$. $R^{17}$ and $R^{24}$ represent a single bond or a linear or branched alkylene group having 1–4 carbon atoms. $R^{18}$ represents a single bond or a linear or branched alkylene group having 1–4 carbon atoms. $R^{19}$ and $R^{20}$ represent a trifluoromethyl group or a methyl group but that both of $R^{19}$ and $R^{20}$ cannot be a methyl group at the same time, $R^{25}$ represents a fluorine atom or trifluoromethyl group. $R^{21}$ and $R^{26}$ represent a hydrogen atom or an acid labile group. $R^{28}$ represents a cyclic alkylene group having 4–20 carbon atoms, which may be a cyclic alkylene group with a bridge, and may contain an oxygen atom or a sulfur atom. $R^{29}$ and $R^{30}$ each represent a fluorine atom or a hydrogen atom. $Z^1$ represents a cyclic hydrocarbon group with a bridge having 4–12 carbon atoms, which may contain —O— or —S—. $Y^1$ and $Y^2$ each represent —O— or —C(=O)—O—. a, b and c fall within the range that $0.1 \leq a \leq 0.8$, $0 \leq b \leq 0.8$, $0 \leq c \leq 0.8$, $0.05 \leq b+c \leq 0.8$.)

In this case, the repeating unit represented by the above-mentioned general formula (1c) may be a repeating unit represented by the following general formula (1c-1).

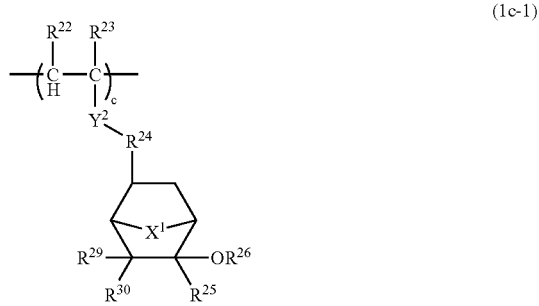

(1c-1)

(In the formula, $R^{22}$ to $R^{26}$, $R^{29}$, $R^{30}$, $Y^2$ and c are the same as mentioned above. $X^1$ represents any one of a single bond, a methylene group, an ethylene group, an oxygen atom, or a sulfur atom.)

Such a positive resist composition which comprises the above-mentioned polymer as a base resin has a sharply high alkaline dissolution-rate contrast before and after exposure on exposure to a high energy beam, has a high sensitivity and a high resolution, and has a reduced line edge roughness since swelling at the time of development is suppressed. Furthermore, etch residues thereof is few, and etch resistance thereof is excellent. Therefore, since it has these characteristics, it is very practical, and is suitable as a micropatterning material for the VLSI manufacture, or photomask patterning.

And it is desirable that the positive resist composition of the present invention is a chemically amplified resist composition which further contains an organic solvent and an acid generator.

As described above, if the polymer of the present invention is used as a base resin and an organic solvent and an acid generator are further blended therein, it can be the chemically amplified positive resist composition with very high sensitivity since a dissolution rate of the above-mentioned polymer in a developer in an exposed area is accelerated by an acid catalyzed reaction, and is very suitable as a micropatterning material for the VLSI manufacture or the like which has been demanded in recent years.

In this case, the positive resist composition of the present invention may contain a dissolution inhibitor further.

By blending a dissolution inhibitor in the positive resist composition as described above, the difference of the dissolution rate in the exposed area and the non-exposed area can be enhanced further, and a resolution can be improved further.

Moreover, in the positive resist composition of the present invention, a basic compound and/or a surfactant may be further blended as an additive.

For example, a diffusion rate of an acid in a resist film can be suppressed and a resolution can be further improved, by adding a basic compound as descried above, and an application property of a resist composition can be further improved or controlled by adding a surfactant.

Such a resist composition of the present invention can be used for patterning process on a semiconductor board, a mask board, or the like by performing at least a process of applying the resist composition on a substrate, a process of exposing it to a high energy beam after heat-treatment, and a process of developing using a developer.

Of course, development may be conducted after heat treatment following exposure, and other various processes, such as an etching process, a resist removing process, a washing process or the like may be performed.

In this case, the above-mentioned high energy beam may have a wavelength in the range of 180 nm–200 nm.

The resist composition which contains the polymer of the present invention as a base resin can be suitably used especially on exposure to a high energy beam with a wavelength in the range of 180 nm–200 nm, and sensitivity is excellent at an exposure wavelength in this range.

As explained above, the present invention provides a polymer copolymerized by the monomer which is an ester for obtaining a repeating unit with an exo form and the monomer which is a compound for obtaining a repeating unit having a substituted or unsubstituted alcohol having a fluorinated alkyl group or a fluorine atom at an a position. By blending this polymer as a base resin in the resist composition, there can be obtained the resist composition which has high sensitivity and high resolution, and a reduced line edge roughness wherein the residue after development is reduced, and swelling during development measured according to QCM method or the like is suppressed. Therefore, it is possible to provide a positive resist composition, such as a chemically amplified positive resist composition or the like especially suitable as a micropatterning material for the VLSI manufacture or photomask patterning.

BRIEF DESCRIPTION OF THE DRAWINGS

FIG. 1 is a graph which shows the result of the measurement which performed according to the QCM method as for the resist formed of the resist composition of Example 3.

DESCRIPTION OF THE INVENTION AND EMBODIMENT

Figure 2:
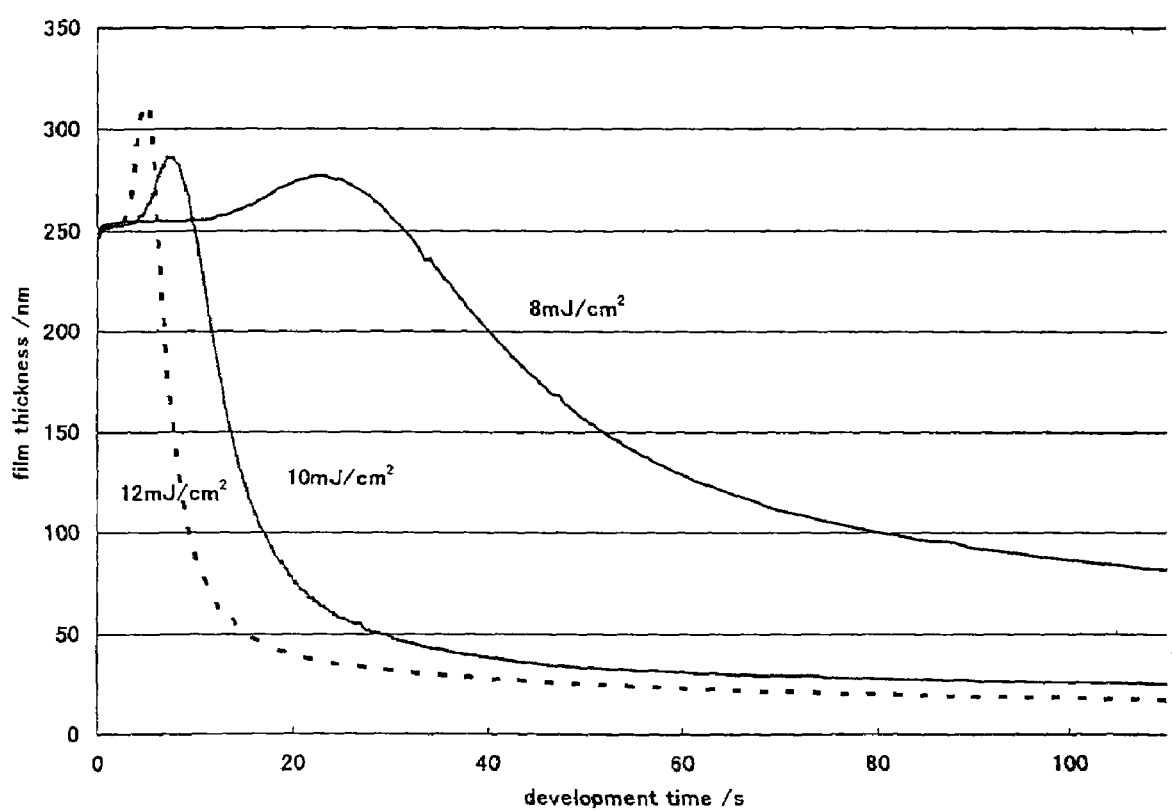
FIG. 2 is a graph which shows the result of the measurement which performed according to the QCM method as for the resist formed of the resist composition of Comparative Example 1.

The inventors of the present invention have studied thoroughly in order to obtain a positive resist composition which has a high sensitivity and high resolution wherein line edge roughness is reduced since swelling at the time of development is suppressed and the residue after development is little on exposure to a high energy beam.

It has been disclosed that the resist composition which comprises a polymer comprising a monomer having an acid labile group with exo form as a base resin has high resolution and low post exposure bake (PEB) dependency since it has a high acid desorbing property and a low activation energy in deprotection reaction (Japanese Patent Application Laid-open (KOKAI) No. 2000-327633).

Moreover, the resist using the hexafluoro alcohol is examined for $F_2$ lithography. It has been reported that a hexafluoro alcohol has an acidity equivalent to phenol, and swelling thereof in a developer is small (J. Photopolym. Sci. Technol., Vol. 16, No. 4, p 523 (2003)). Moreover, polynorbornene having a hexafluoro alcohol, and α trifluoromethyl acrylate having a pendant hexafluoro alcohol have been disclosed there, and exposure characteristics on exposure to ArF excimer lasers have also been disclosed.

Then, the inventors have applied it, and found that a positive resist composition which has high sensitivity and high resolution wherein line edge roughness due to swelling at the time of development is reduced and the residue after development is little can be provided by using a polymer as a base resin obtained by combining (meth)acrylate in exo form which has a particular acid labile group and an adhesion group which has aqueous alkaline solubility represented by hexafluoro alcohol. Thereby the present invention has been completed.

Namely, the polymer according to the present invention is a polymer which at least has the repeating unit represented by the following general formula (1a), and the repeating unit represented by the following general formula (1b) and/or the repeating unit represented by the following general formula (1c).

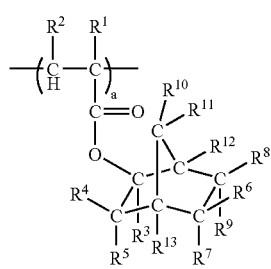

(1a)

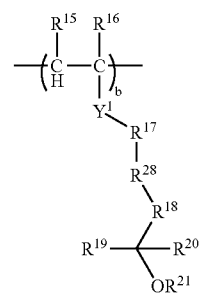

(1b)

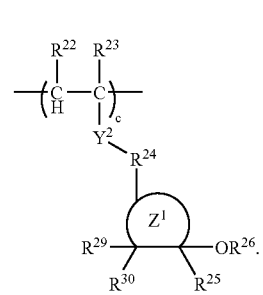

(1c)

(In the formulae, $R^1$ represents a hydrogen atom, a methyl group or —$CH_2CO_2R^{14}$, $R^2$ represents a hydrogen atom, a methyl group or —$CO_2R^{14}$. $R^3$ represents a linear, branched or cyclic alkyl group having 1–8 carbon atoms or an aryl group having 6–20 carbon atoms which may be substituted. $R^4$ to $R^9$, $R^{12}$ and $R^{13}$ each independently represents a hydrogen atom or a monovalent hydrocarbon group having 1–15 carbon atoms which may contain a hetero atom, and $R^{10}$ and $R^{11}$ represent a hydrogen atom. Any one or more of $R^4$ and $R^5$, $R^6$ and $R^8$, $R^6$ and $R^9$, $R^7$ and $R^9$, $R^7$ and $R^{13}$, $R^8$ and $R^{12}$, $R^{10}$ and $R^{11}$, and $R^{11}$ and $R^{12}$ may form a ring together. In that case, they represent a divalent hydrocarbon group having 1–15 carbon atoms which may contain a hetero atom. Any one or more of $R^4$ and $R^{13}$, $R^{10}$ and $R^{13}$, and $R^6$ and $R^8$ which bond to adjacent carbon atoms may directly bond to each other to form a double bond. $R^{14}$ represents a hydrogen atom, or a linear, branched or cyclic alkyl group having 1–15 carbon atoms. The above-mentioned general formula (1a) may represent an enantiomer. $R^{16}$ and $R^{23}$ represent a hydrogen atom, a methyl group, or —$CH_2CO_2R^{14}$. $R^{15}$ and $R^{22}$ represent a hydrogen atom, a methyl group, or —$CO_2R^{14}$. $R^{17}$ and $R^{24}$ represent a single bond or a linear or branched alkylene group having 1–4 carbon atoms. $R^{18}$ represents a single bond or a linear or branched alkylene group having 1–4 carbon atoms. $R^{19}$ and $R^{20}$ represent a trifluoromethyl group or a methyl group, but both of $R^{19}$ and $R^{20}$ cannot be a methyl group at the same time, $R^{25}$ represents a fluorine atom or trifluoromethyl group. $R^{21}$ and $R^{26}$ represent a hydrogen atom or an acid labile group. $R^{28}$ represents a cyclic alkylene group having 4–20 carbon atoms, which may be a bridged cyclic alkylene group, and may contain an oxygen atom and/or a sulfur atom. $R^{29}$ and $R^{30}$ each represents a fluorine atom or a hydrogen atom. $Z^1$ represents a bridged cyclic hydrocarbon group having 4–12 carbon atoms, which may contain —O— and/or —S—. $Y^1$ and $Y^2$ each represents —O— or —C(=O)—O—. a, b and c fall within the range that $0.1 \leq a \leq 0.8$, $0 \leq b \leq 0.8$, $0 \leq c \leq 0.8$, $0.05 \leq b+c \leq 0.8$.)

The positive resist composition which contains such a polymer of the present invention as a base resin has a significantly high alkaline dissolution-rate contrast before and after exposure on exposure to the high energy beam, has high sensitivity and high resolution, and line edge roughness is reduced since swelling during development is suppressed, and residue after development is little and etch resistance is improved. By having these characteristics, it is highly practical and suitable as a micropatterning material for the VLSI manufacture, or photomask patterning.

In this case, the repeating unit represented by the above-mentioned general formula (1c) may be a repeating unit represented by a following general formula (1c-1).

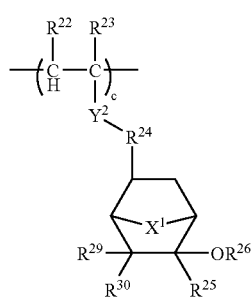

(1c-1)

(In the formula, $R^{22}$ to $R^{26}$, $R^{29}$, $R^{30}$, $Y^2$ and c are the same as mentioned above. $X^1$ represents any one of a single bond, a methylene group, an ethylene group, an oxygen atom, and a sulfur atom.)

The ester monomer for obtaining the repeating unit of exo form shown in the formula (1a) can be, for example, monomers shown in Japanese Patent Application Laid-open (KOKAI) No. 2000-327633. Illustrative examples thereof may be listed below. However, it is not limited thereto.

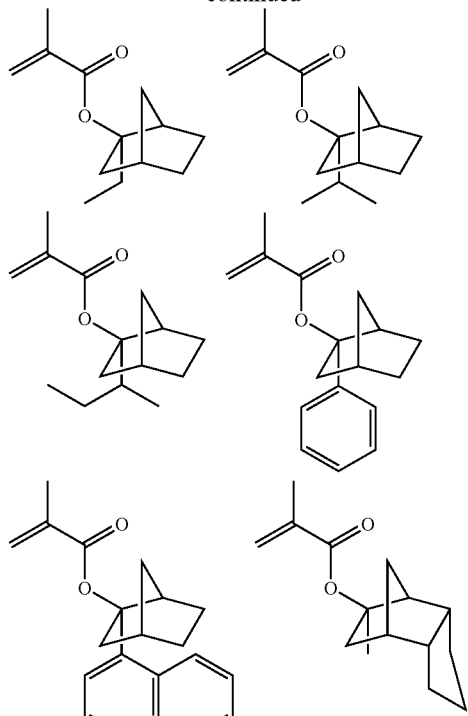

-continued

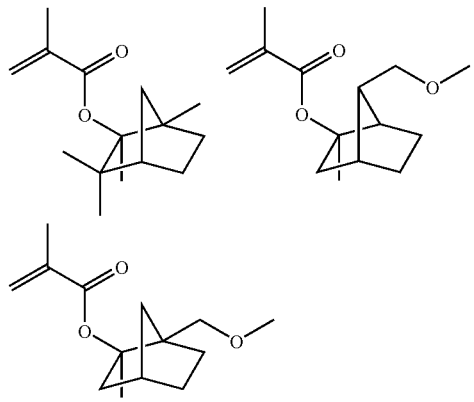

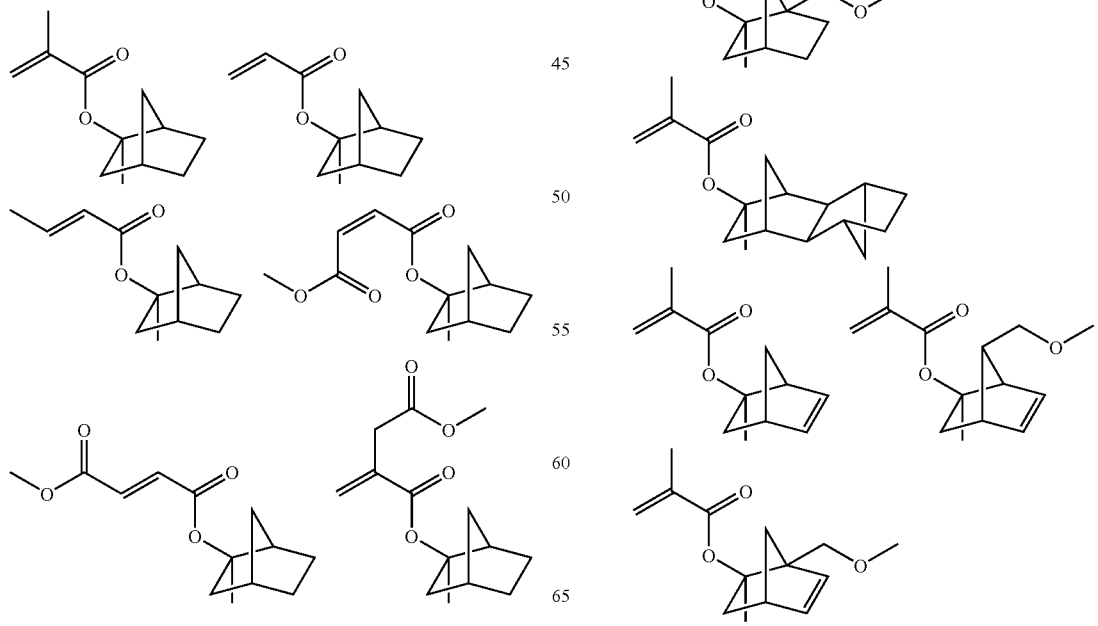

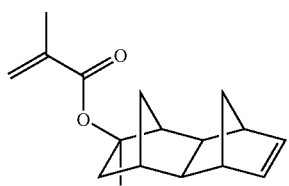
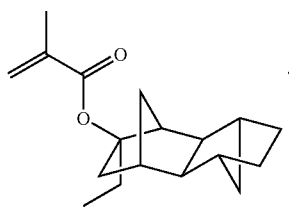
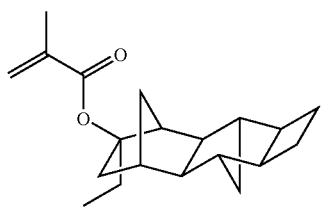
The ester monomer for obtaining the repeating unit having a substituted or unsubstituted alcohol with a fluorinated alkyl group or a fluorine atom at α-position shown in the general formulae (1b), (1c) and (1c-1) can be listed below.
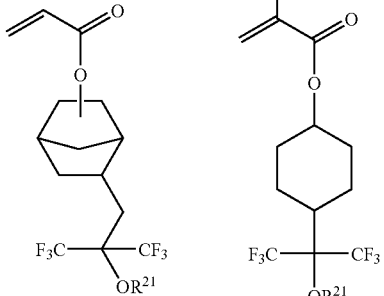
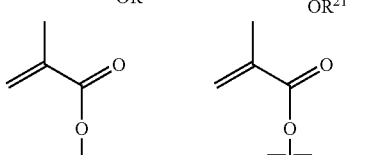
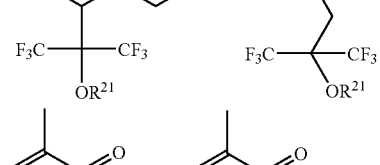
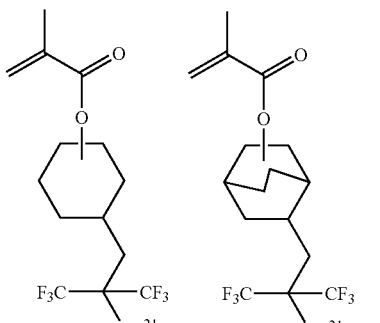
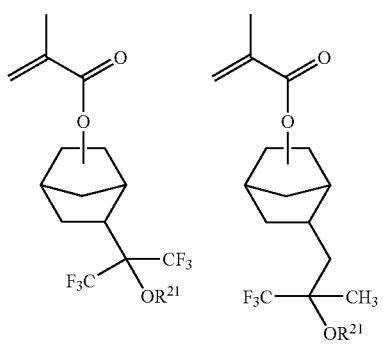
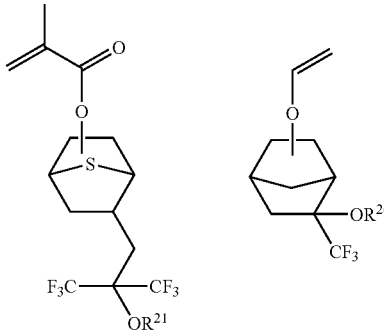
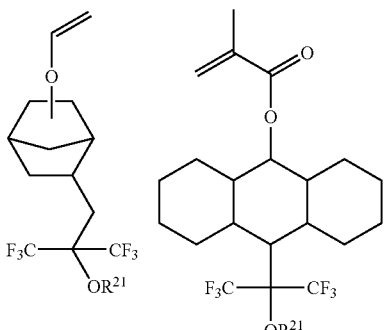

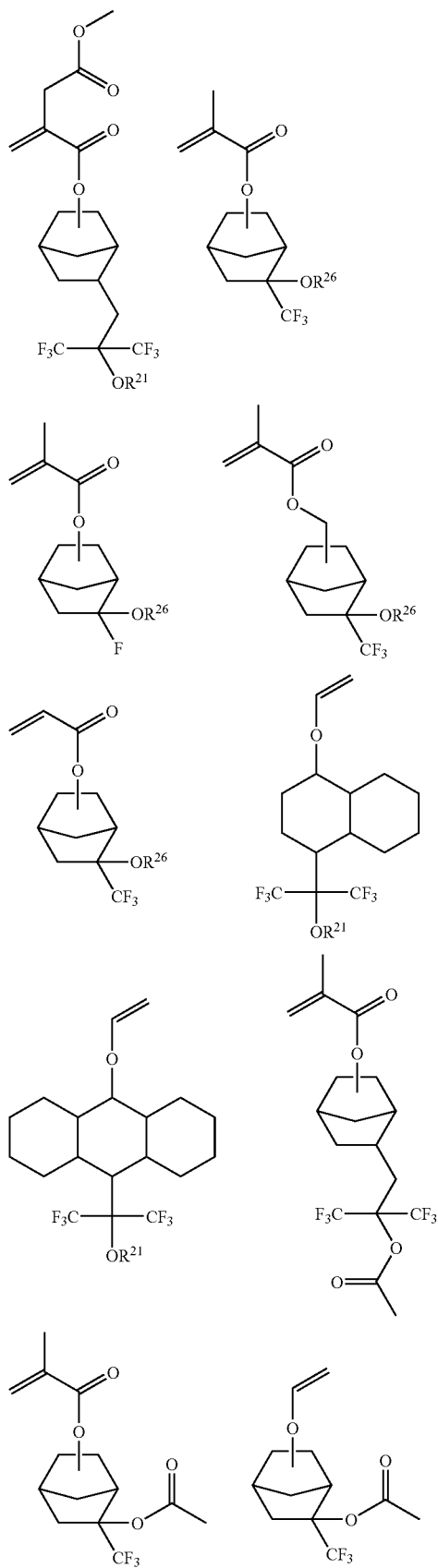
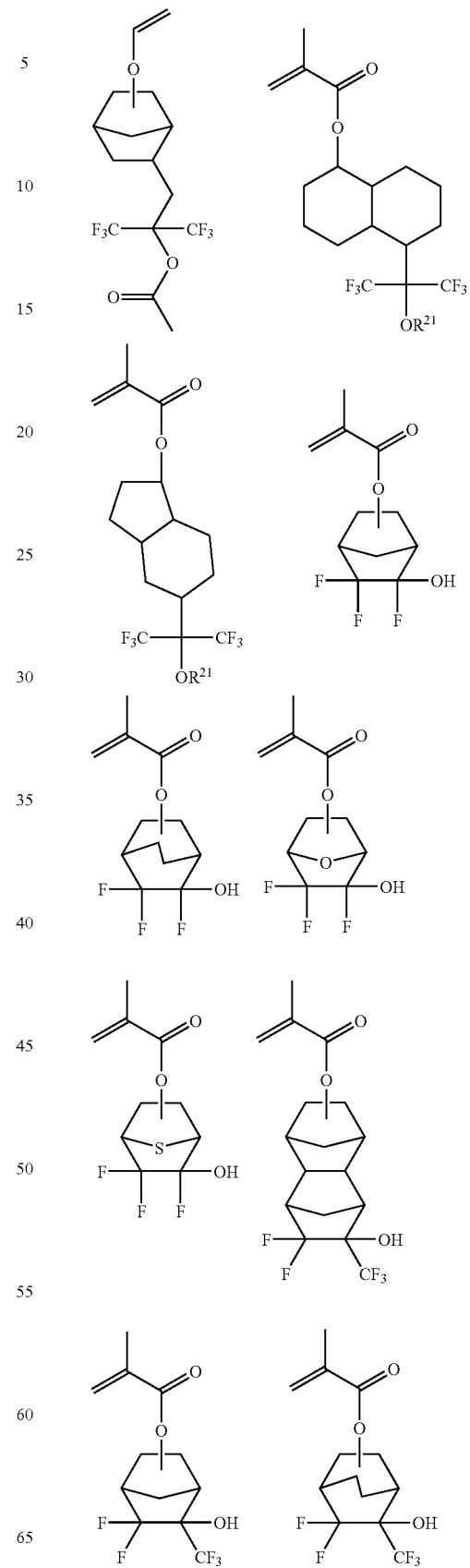

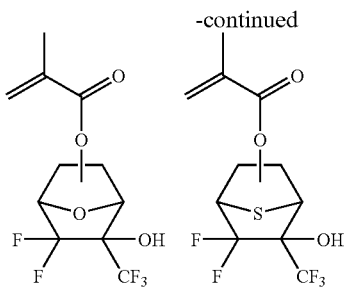

(In the formulae, $R^{21}$ and $R^{26}$ are the same as explained above. The monomers before polymerization may be the same as $R^{21}$ and $R^{26}$, or may be an acetyl group as mentioned partly above and may be converted to a hydroxy group by alkaline hydrolysis after polymerization, and if necessary, a hydrogen atom of a hydroxy group may be substituted with an acid labile group thereafter.)

The polymer of the present invention is characterized in that it is obtained by copolymerizing the ester monomer for obtaining the repeating unit of exo form shown in the general formula (1a) and the ester for obtaining a repeating unit having a substituted or unsubstituted alcohol having a fluorinated alkyl group or a fluorine atom at an α position represented by the formulae (1b) and (1c). Furthermore, the ester monomer (1d) (the repeating unit d) having an acid labile group other than those represented by the general formula (1a) can be copolymerized.

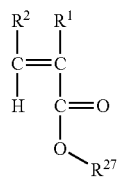

(1d)

(In the formula, $R^1$ and $R^2$ represent the same as mentioned above, $R^{27}$ represents an acid labile group.)

Next, acid labile groups represented by $R^{21}$, $R^{26}$ and $R^{27}$ in the general formulae (1b), (1c), (1c-1) and (1d) can be selected variously, and they may be the same or different. They may have the structure wherein hydrogen atom of a hydroxyl group or a hydroxyl group of a carboxyl group is substituted especially with the group represented by the following formula (AL10), (AL11), a tertiary alkyl group having 4–40 carbon atoms represented by the following formula (AL12), an oxoalkyl group having 4–20 carbon atoms or the like.

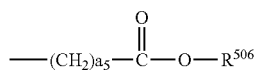
(AL10)

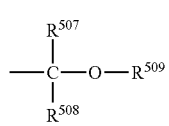
(AL11)

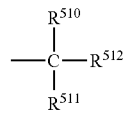
(AL12)

In the formulae (AL10), (AL11), $R^{506}$ and $R^{509}$ represent a linear, branched or cyclic alkyl group having 1–20 carbon atoms, and may contain hetero atoms, such as oxygen, sulfur, nitrogen, fluorine or the like. $R^{507}$ and $R^{508}$ represent a hydrogen atom, a linear, branched or cyclic alkyl group having 1–20 carbon atoms which may contain a hetero atom such as oxygen, sulfur, nitrogen, fluorine or the like, a5 is an integer of 0–10. $R^{507}$ and $R^{508}$, $R^{507}$ and $R^{509}$, $R^{508}$ and $R^{509}$ may bond to each other to form a ring.

Illustrative examples of the compound represented by the formula (AL10) may include: tert-butoxy carbonyl group, tert-butoxy carbonyl methyl group, tert-amyloxy carbonyl group, tert-amyloxy carbonyl methyl group, 1-ethoxy ethoxy carbonyl methyl group, 2-tetrahydropyranyl oxy-carbonyl methyl group, 2-tetrahydrofuranyl oxy-carbonyl methyl group, or the like, and further the substituents represented by the following general formulae (AL10)-1 to (AL10)-9.

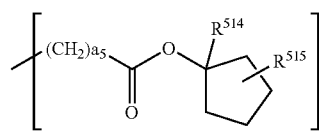
(AL10)-1

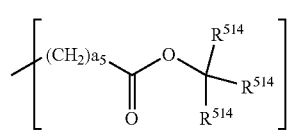
(AL10)-2

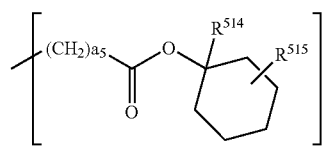
(AL10)-3

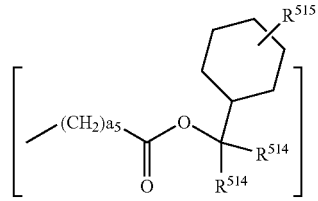
(AL10)-4

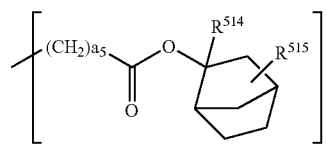
(AL10)-5

-continued

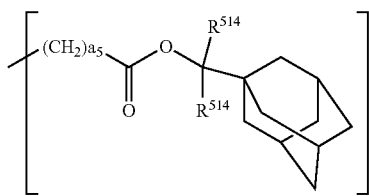 (AL10)-6

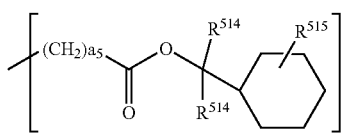 (AL10)-7

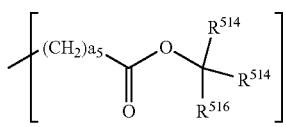 (AL10)-8

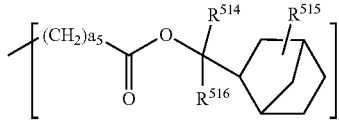 (AL10)-9

In the formulae (AL10)-1 to (AL10)-9, $R^{514}$ may be the same or different, and represents a linear, branched or cyclic alkyl group having 1–8 carbon atoms, an aryl group or aralkyl group having 6–20 carbon atoms. $R^{515}$ does not exist or represents a linear, branched or cyclic alkyl group having 1–20 carbon atoms. $R^{516}$ represents an aryl group or an aralkyl group having 6–20 carbon atoms.

Example of the acetal compound represented by the above-mentioned formula (AL11) may include those represented by the formulae (AL11)-1 to (AL11)-33.

—CH₂—O—CH₃ (AL11)-1

—CH₂—O—CH₂—CH₃ (AL11)-2

—CH₂—O—(CH₂)₂—CH₃ (AL11)-3

—CH₂—O—(CH₂)₃—CH₃ (AL11)-4

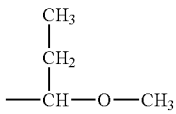 (AL11-5)

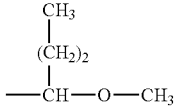 (AL11)-6

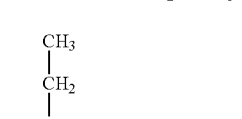 (AL11)-7

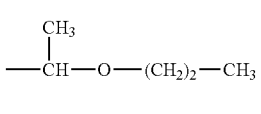 (AL11)-8

(AL11)-9

(AL11)-10

(AL11)-11

(AL11)-12

(AL11)-13

(AL11-14)

(AL11)-15

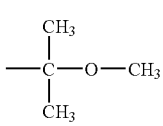 (AL11)-16

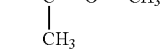 (AL11)-17

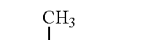 (AL11)-18

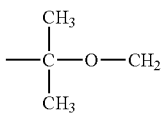

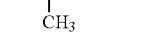 (AL11)-19

 (AL11)-20

 (AL11)-21

-continued

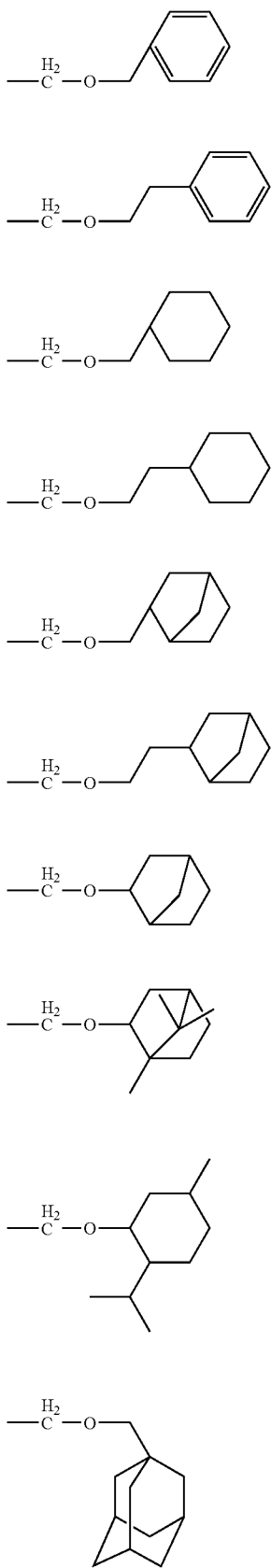

(AL11)-22
(AL11)-23
(AL11)-24
(AL11)-25
(AL11)-26
(AL11)-27
(AL11)-28
(AL11)-29
(AL11)-30
(AL11)-31

-continued

(AL11)-32

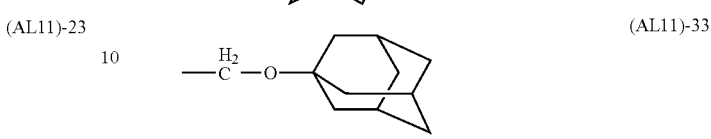
(AL11)-33

The base resin may be crosslinked between the molecules or in the molecule by the acid labile group represented by the general formulae (AL-11a) or (AL-11b).

(AL-11a)

(AL-11b)

In the formulae, $R^{33}$ and $R^{34}$ represent a hydrogen atom, a linear, branched or cyclic alkyl group having 1–8 carbon atoms. Alternatively, $R^{33}$ and $R^{34}$ may bond to each other to form a ring. In the case that $R^{33}$ and $R^{34}$ form a ring, they represent a linear or branched alkylene group having 1–8 carbon atoms. $R^{35}$ represents a linear, branched or cyclic alkylene group having 1–10 carbon atoms, b5 and d5 represent an integer of 0 or 1 to 10, preferably an integer of 0 or 1 to 5, C5 represents an integer of 1 to 7. A represents an aliphatic or alicyclic saturated hydrocarbon group, an aromatic hydrocarbon group or a heterocyclic group of (c5+1) valence having 1 to 50 carbon atoms, these groups may be bonded via a hetero atom such as O, S, N or the like, and a part of hydrogen atoms bonded to a carbon atom of these groups may be substituted with a hydroxyl group, a carboxyl group, a carbonyl group or a fluorine atom. B represents —CO—O—, —NHCO—O— or —NH-CONH—.

In this case, it is preferable that A represents a 2 to 4 valent linear, branched or cyclic alkylene group, an alkyl-tri-yl group and an alkyl-tetra-yl group having 1–20 carbon atoms, an arylene group having 6–30 carbon atoms. These groups may be bonded via a hetero atom such as O, S, N or the like, a part of hydrogen atoms bonded to a carbon atom of these groups may be substituted with a hydroxyl group, a carboxyl group, an acyl group or a halogen atom. c5 preferably represents an integer of 1 to 3.

Illustrative examples of the crosslinked acetal groups represented by the general formulae (AL-11a) and (AL-11b) may include: those represented by the following formulae: (AL-11)-34 to (AL-11)-41.

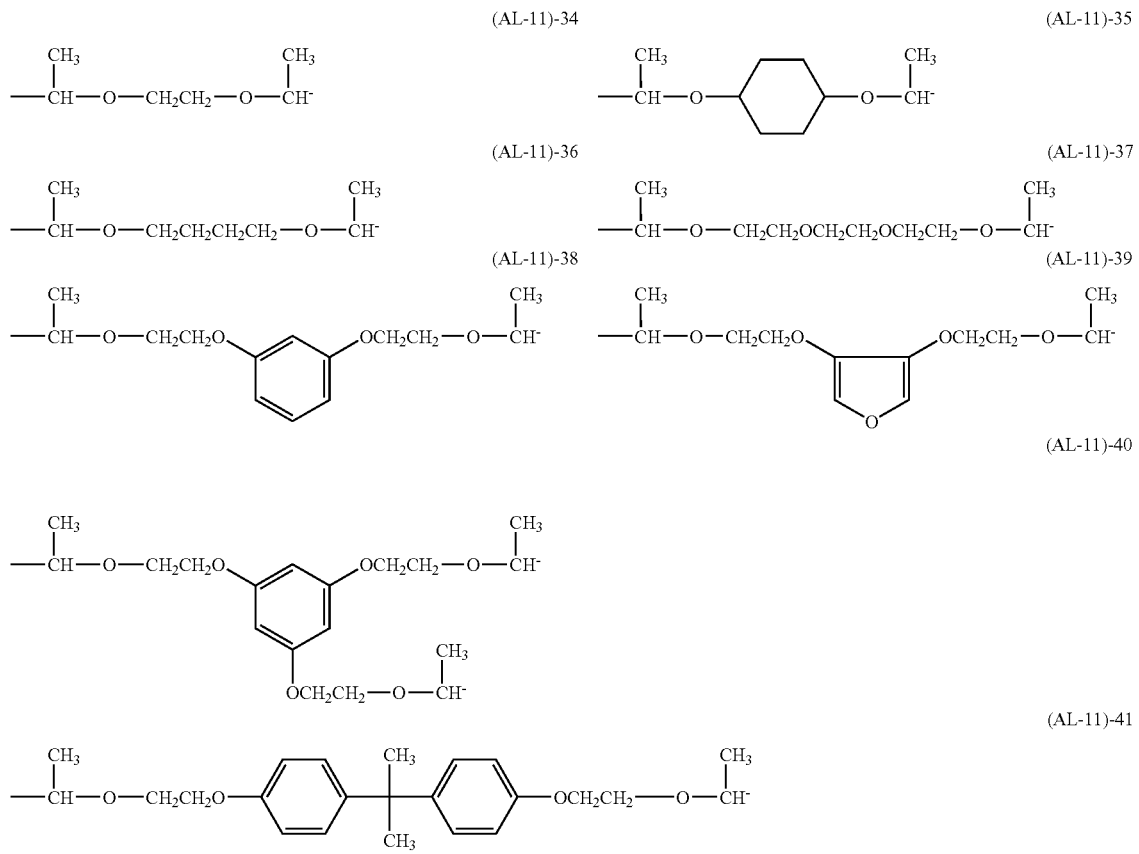

Examples of the tertiary alkyl group shown in the above-mentioned formula (AL12) may include: tert-butyl group, triethyl carbyl group, 1-ethyl norbornyl group, 1-methyl cyclohexyl group, 1-ethyl cyclopentyl group, 2-(2-methyl) adamantyl group, 2-(2-ethyl)adamantyl group, tert-amyl group or the like, or those represented by the following general formulae (AL12)-1 to (AL12)-18.

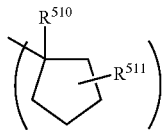 (AL12)-1

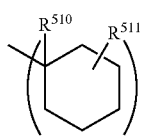 (AL12)-2

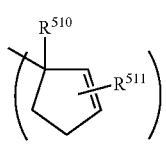 (AL12)-3

-continued

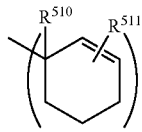 (AL12)-4

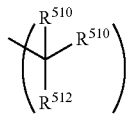 (AL12)-5

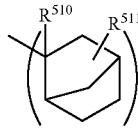 (AL12)-6

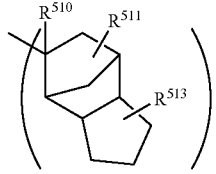 (AL12)-7

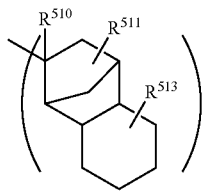
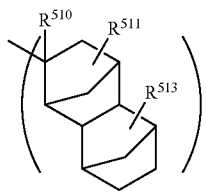
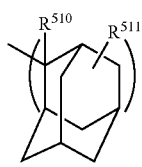
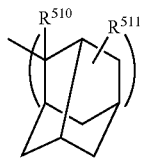
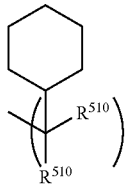
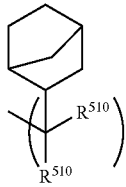
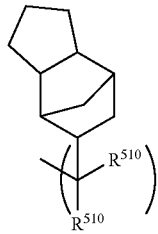
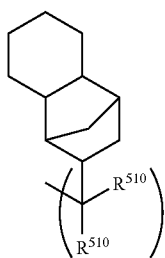

(AL12)-8
(AL12)-9
(AL12)-10
(AL12)-11
(AL12)-12
(AL12)-13
(AL12)-14
(AL12)-15

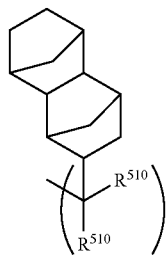

(AL12)-16
(AL12)-17
(AL12)-18

In the above-mentioned formulae, $R^{510}$ may be the same or different, represents a linear, branched or cyclic alkyl group having 1–8 carbon atoms, an aryl group or aralkyl group having 6–20 carbon atoms. $R^{511}$ and $R^{513}$ do not exist, or represent a linear, branched or cyclic alkyl group having 1–20 carbon atoms. $R^{512}$ represents an aryl group or aralkyl group having 6–20 carbon atoms.

Furthermore as shown in (AL12)-19 and (AL12)-20, the polymer may be crosslinked between the molecules or in the molecule, including $R^{514}$ which is an alkylene group or arylene group of two or more valences. $R^{510}$ in the formulae (AL12)-19 and (AL12)-20 may be the same as mentioned above, $R^{514}$ may represent a linear, branched or cyclic alkylene group or arylene group having 1–20 carbon atoms, and may contain hetero atoms such as an oxygen atom, a sulfur atom, a nitrogen atom or the like. b6 is an integer of 1–3.

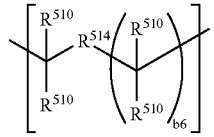

(AL12)-19

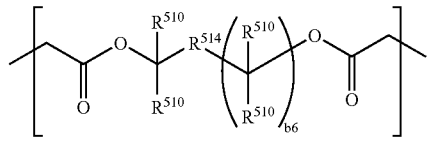

(AL12)-20

Furthermore, $R^{510}$, $R^{511}$, $R^{512}$, and $R^{513}$ may have hetero atoms, such as oxygen, nitrogen, sulfur or the like. Specifically, they may be shown by the following (AL13)-1 to (AL13)-7.

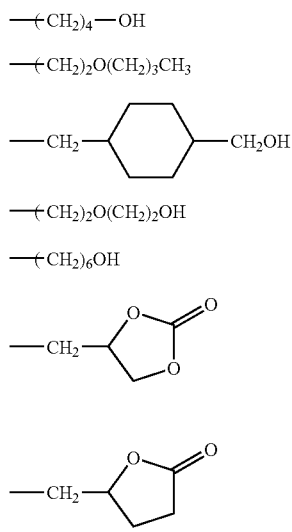

The polymer of the present invention always comprises the repeating unit represented by the general formula (1a), and the repeating unit represented by the general formula (1b) and/or (1c). However, the repeating unit which has an adhesion group other than the repeating units represented by a general formulae (1a), (1b) and (1c) can also be copolymerized therewith. Specifically, the repeating unit which has an adhesion group can be the repeating unit e wherein the monomers (1e) illustrated below are polymerized.

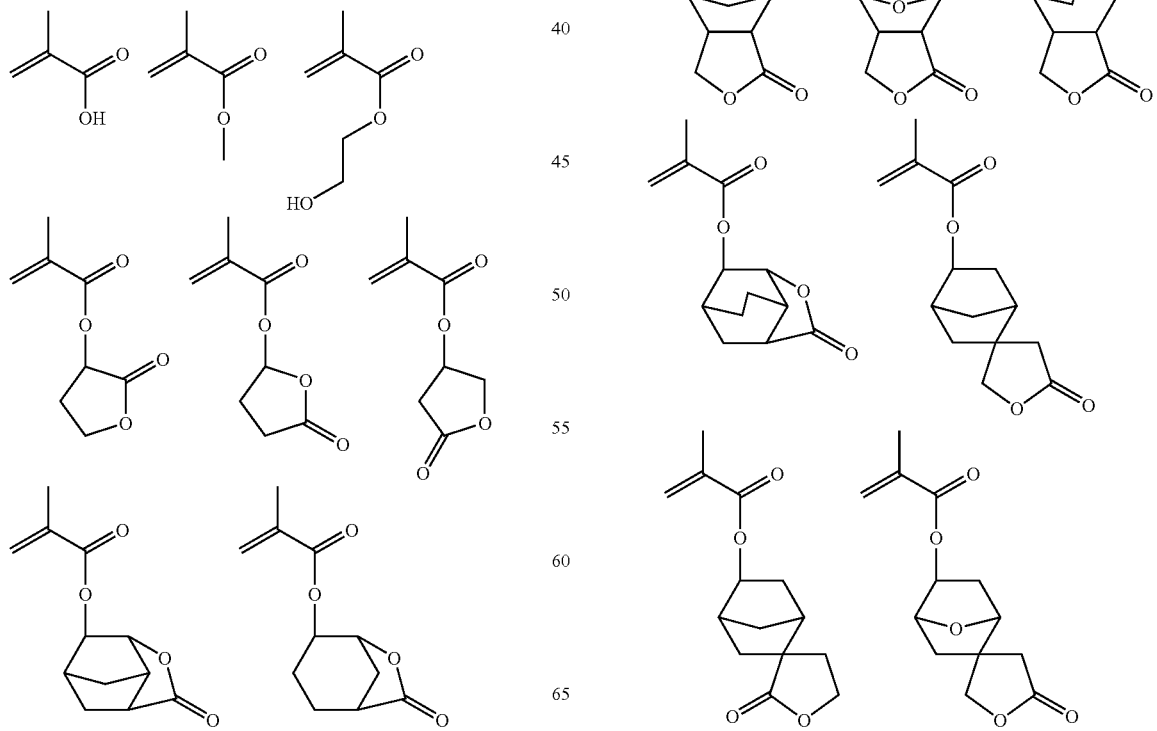

-continued

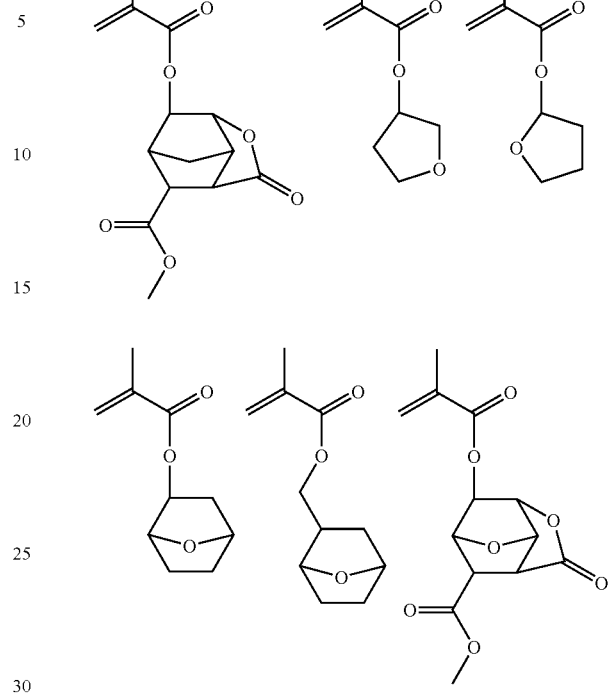

-continued
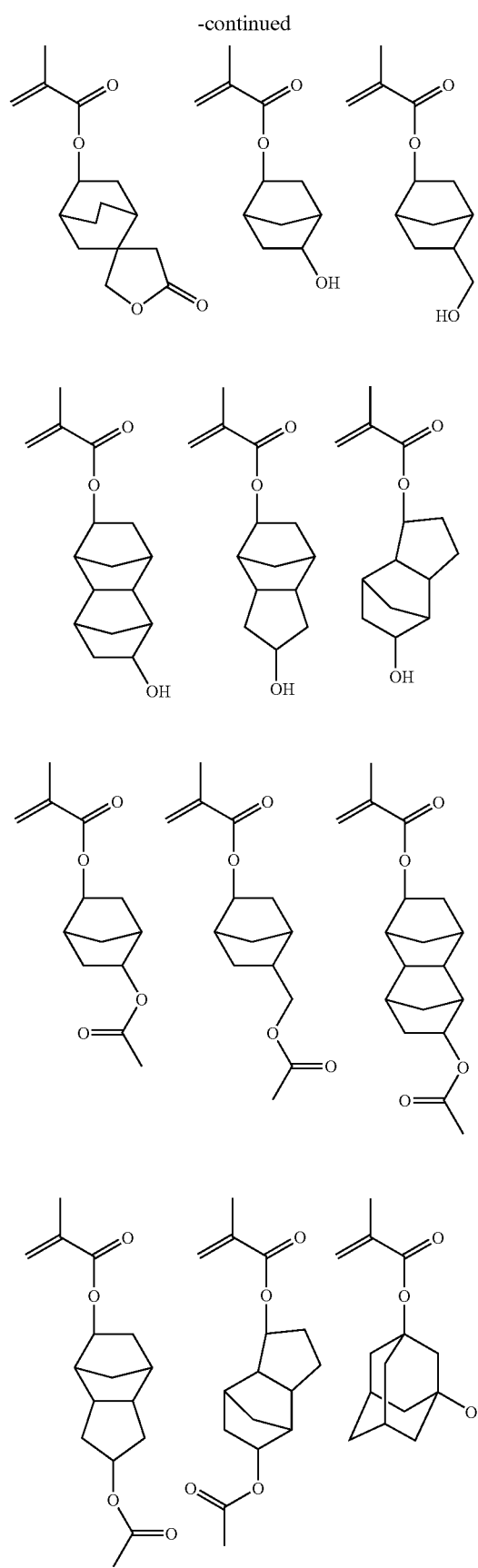
-continued
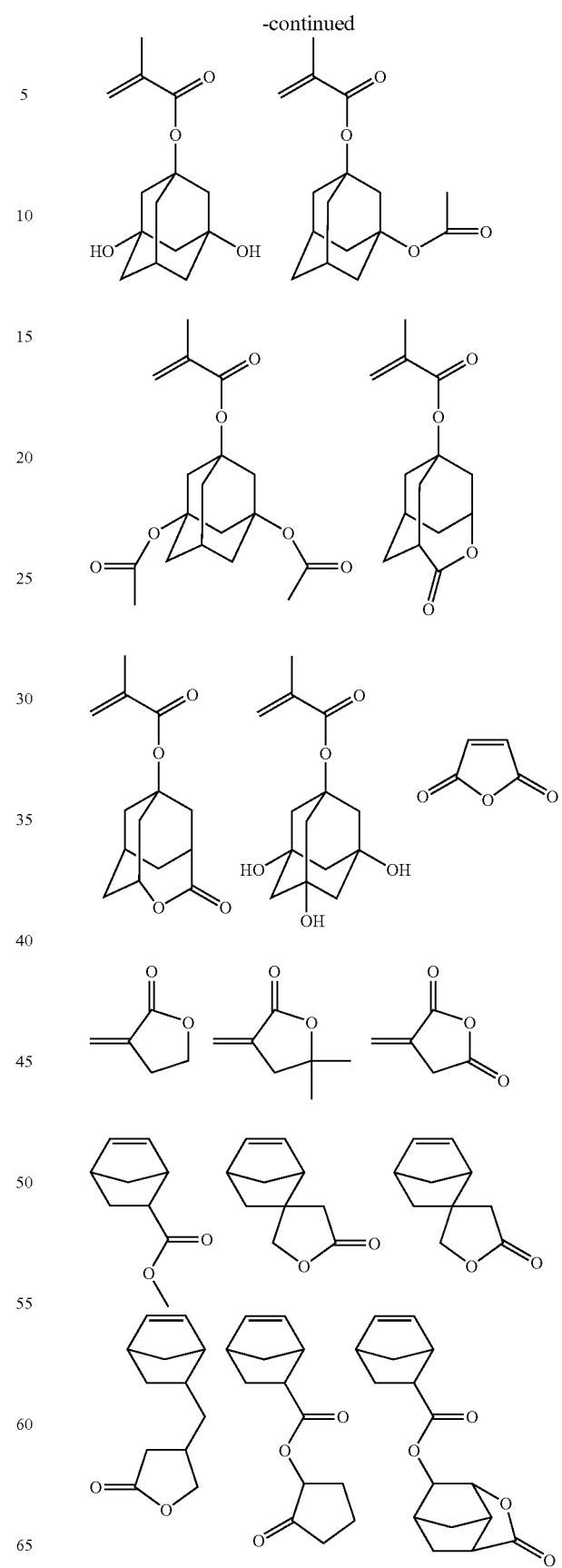

-continued

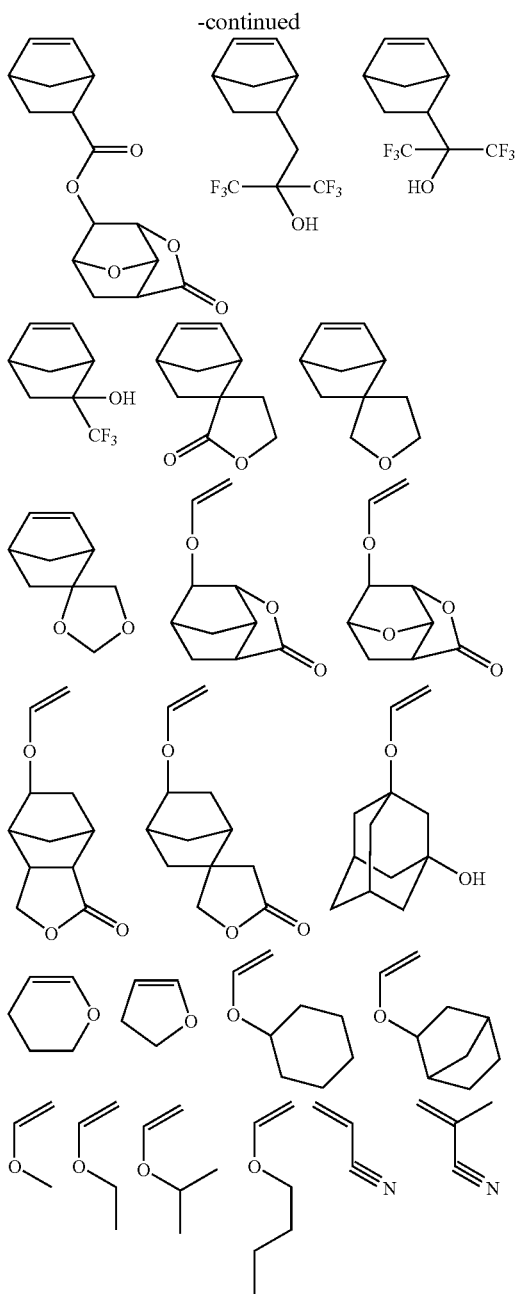

In the general formulae (1a), (1b) and (1c), a ratio of the repeating units a, b and c is the value such that $0.1 \leq a \leq 0.8$, $0 \leq b \leq 0.8$, $0 \leq c \leq 0.8$, $0.05 \leq b+c \leq 0.8$, preferably $0.15 \leq a \leq 0.7$, $0 \leq b \leq 0.7$, $0 \leq c \leq 0.7$, $0.07 \leq b+c \leq 0.7$.

Furthermore, when the monomers (1d) and (1e) are copolymerized, the ratio of the repeating units d and e is the value such that $0 \leq d/(a+b+c+d+e) \leq 0.6$, preferably $0 \leq d/(a+b+c+d+e) \leq 0.5$, $0 \leq e/(a+b+c+d+e) \leq 0.8$, preferably $0 \leq e/(a+b+c+d+e) \leq 0.7$.

The polymer of the present invention each has a mass average molecular weight (a measuring method is as mentioned below) of 1,000–500,000, preferably 2,000–30,000. If a mass average molecular weight is too small, heat resistance of the resist composition will be degraded. If it is too large, an aqueous alkaline solubility will be lowered, and it will become easy to cause footing profile after patterning formation.

Furthermore, if the polymer of the present invention has a large molecular weight distribution (Mw/Mn), there is a possibility that impurities may be observed on a pattern, or a shape of a pattern may be degraded after exposure, since there exist the polymers whose molecular weight are low and high. So, if the pattern rule becomes finer, the influence by a molecular weight or a dispersion of a molecular weight easily gets larger. Accordingly, in order to obtain the resist composition used suitably for a micropatterning size, it is desirable to use a multi-component copolymer with narrow molecular weight dispersion of 1.0–2.0, preferably 1.0–1.5.

Moreover, it is also possible to blend two or more polymers having a different composition ratio, a different molecular weight distribution, or a different molecular weight.

In order to synthesize these polymers, there is a method of adding a radical initiator to a monomer which has an unsaturated bond for obtaining the repeating units a, b and c, and the monomer represented by the repeating unit d and e in an organic solvent, to perform heating polymerization, and thereby, the polymer can be obtained. Examples of the organic solvent used at the time of polymerization may include: toluene, benzene, tetrahydrofuran, diethyl ether, dioxane, or the like. Examples of the polymerization initiator may include: 2,2'-azobisisobutyronitril (AIBN), 2,2'-azo bis (2,4-dimethyl valeronitrile), dimethyl 2,2-azo bis (2-methyl propionate), benzoyl peroxide, lauroyl peroxide, or the like. The polymers can be polymerized at an elevated temperature of 50° C. to 80° C. The reaction time may be 2 to 100 hours, preferably 5–20 hours. The acid labile group may be used as those introduced into the monomer, or the acid labile group may be released by an acid catalyst once and then protected or partially protected.

The positive resist composition of the present invention may contain, an organic solvent, the compound which generates an acid upon a high energy beam (acid generator), and if necessary a dissolution inhibitor, a basic compound, a surfactant, and other components.

Organic solvents used for the resist composition of the present invention, especially for chemically amplified positive resist composition can be any organic solvents in which a base resin, an acid generator and other additives can be dissolved. Examples of such an organic solvent may include: ketones such as cyclohexanone, methyl-2-n-amyl ketone and the like; alcohols such as 3-methoxy butanol, 3-methyl-3-methoxy butanol, 1-methoxy-2-propanol, 1-ethoxy-2-propanol and the like; ethers, such as propylene glycol monomethyl ether, ethylene glycol monomethyl ether, propylene glycol monomethyl ether, ethylene glycol monoethyl ether, propylene glycol dimethyl ether, diethylene glycol dimethyl ether and the like; esters, such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono tert-butyl ether acetate and the like; lactones such as γ-butyrolactone and the like. They can be used alone or in admixture. However, they are not limited thereto. Among the above-mentioned organic solvents, diethylene glycol dimethyl ether, 1-ethoxy-2-propanol, propylene glycol monomethyl ether acetate, and an admixture thereof, which have the best dissolution property of an acid generator in the resist component are preferably used.

The amount of the organic solvent to be used is preferably 200 to 1,000 parts (by weight), especially 400 to 800 parts to 100 parts of the base resin.

Examples of the acid generator used in the present invention are as follow:

i) an onium salt represented by the following general formula (P1a-1), (P1a-2) or (P1b)

ii) a diazomethane derivative represented by the following general formula (P2), iii) a glyoxime derivative represented by the following general formula (P3), iv) a bis sulfone derivative represented by the following general formula (P4), v) a sulfonate of a N-hydroxy imide compound represented by the following general formula (P5), vi) a β-keto sulfonic acid derivative, vii) a disulfone derivative, viii) a nitro benzyl sulfonate derivative, ix) a sulfonate derivative, or the like.

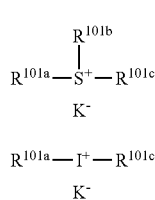

(In the formulae, wherein $R^{101a}$, $R^{101b}$, and $R^{101c}$ independently represent a linear, branched or cyclic alkyl group, alkenyl group, oxoalkyl group or oxoalkenyl group each having 1–12 carbon atoms, an aryl group having 6–20 carbon atoms, an aralkyl group or an aryl oxoalkyl group having 7–12 carbon atoms. Some or all of hydrogen atoms of these groups may be substituted with an alkoxy group or the like. $R^{101b}$ and $R^{101c}$ may form a ring. In the case that they form a ring, $R^{101b}$ and $R^{101c}$ represent an alkylene group having 1–6 carbon atoms respectively. $K^-$ represents a non-nucleophilic counter ion.

The above-mentioned $R^{101a}$, $R^{101b}$ and $R^{101c}$ may be the same or different. Illustrative examples thereof as an alkyl group may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cycloheptyl group, a cyclopropyl methyl group, 4-methyl cyclohexyl group, a cyclohexyl methyl group, a norbornyl group, an adamantyl group, or the like. Illustrative examples of an alkenyl group may include: a vinyl group, an allyl group, a propenyl group, a butenyl group, a hexenyl group, a cyclohexenyl group, or the like. Examples of an oxoalkyl group may include: 2-oxocyclopentyl group, 2-oxocyclohexyl group and the like, and 2-oxopropyl group, 2-cyclopentyl-2-oxoethyl group, 2-cyclohexyl-2-oxoethyl group, 2-(4-methylcyclohexyl)-2-oxoethyl group, and the like. Examples of the oxoalkenyl group may include: 2-oxo-4-cyclohexenyl group, 2-oxo-4-propenyl group and the like. Examples of an aryl group may include: a phenyl group, a naphthyl group and the like, and an alkoxy phenyl groups such as p-methoxyphenyl group, m-methoxyphenyl group, o-methoxyphenyl group, an ethoxyphenyl group, p-tert-butoxyphenyl group, m-tert-butoxy phenyl group and the like, an alkyl phenyl group such as 2-methylphenyl group, 3-methylphenyl group, 4-methylphenyl group, an ethylphenyl group, 4-tert-butylphenyl group, 4-butylphenyl group, a dimethyl phenyl group and the like, an alkyl naphthyl group such as a methylnaphthyl group, an ethyl naphthyl group and the like, an alkoxy naphthyl group such as a methoxy naphthyl group, an ethoxy naphthyl group and the like, a dialkyl naphthyl group such as a dimethyl naphthyl group, a diethyl naphthyl group and the like, a dialkoxy naphthyl group such as a dimethoxy naphthyl group, a diethoxy naphthyl group and the like. Examples of the aralkyl group may include a benzyl group, a phenylethyl group, a phenethyl group and the like. Examples of an aryl oxoalkyl group may include: 2-aryl-2-oxoethyl group such as 2-phenyl-2-oxoethyl group, 2-(1-naphthyl)-2-oxoethyl group, 2-(2-naphthyl)-2-oxoethyl group, or the like. Examples of an non-nucleophilic counter ion as $K^-$ may include: a halide ion such as a chloride ion, a bromide ion or the like, a fluoro alkyl sulfonate such as triflate, 1,1,1-trifluoro ethanesulfonate, nonafluoro butane sulfonate or the like, an aryl sulfonate such as tosylate, benzene sulfonate, 4-fluorobenzene sulfonate, 1,2,3,4,5-pentafluoro benzene sulfonate or the like, an alkyl sulfonate such as mesylate, butane sulfonate or the like.

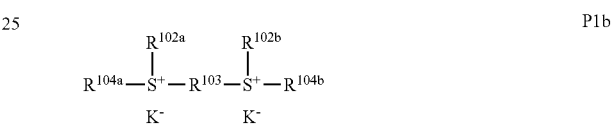

(In the formula, $R^{102a}$ and $R^{102b}$ each represents a linear, branched or cyclic alkyl group having 1–8 carbon atoms. $R^{103}$ represents a linear, branched or cyclic alkylene group having 1–10 carbon atoms. $R^{104a}$ and $R^{104b}$ each represent a 2-oxoalkyl group having 3–7 carbon atoms. $K^-$ represents an non-nucleophilic counter ion.)

Illustrative examples of the above-mentioned $R^{102a}$ and $R^{102b}$ may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cyclopropylmethyl group, 4-methylcyclohexyl group, a cyclohexyl methyl group and the like. Examples of $R^{103}$ may include: a methylene group, an ethylene group, a propylene group, a butylene group, a pentylene group, a hexylene group, a heptylene group, an octylene group, a nonylene group, 1,4-cyclohexylene group, 1,2-cyclohexylene group, 1,3-cyclopentylene group, 1,4-cyclooctylene group, 1,4-cyclohexane dimethylene group and the like. Examples of $R^{104a}$ and $R^{104b}$ may include: 2-oxopropyl group, 2-oxocyclopentyl group, 2-oxocyclohexyl group, 2-oxocycloheptyl and the like. As $K^-$, the same as mentioned in the formulae (P1a-1) and (P1a-2) can be exemplified.

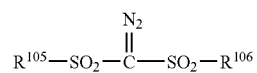

(In the formula, $R^{105}$ and $R^{106}$ represent a linear, branched or cyclic alkyl group or alkyl-halide group having 1–12 carbon atoms, an aryl group or aryl-halide group having 6–20 carbon atoms, or an aralkyl group having 7–12 carbon atoms.)

Examples of an alkyl group as $R^{105}$ and $R^{106}$ may include: a methyl group, an ethyl group, a propyl group, an isopropyl group, n-butyl group, sec-butyl group, tert-butyl group, a pentyl group, a hexyl group, a heptyl group, an octyl group, an amyl group, a cyclopentyl group, a cyclohexyl group, a cycloheptyl group, a norbornyl group, an adamantyl group and the like. Examples of a halogenated alkyl group as $R^{105}$ and $R^{106}$ may include: trifluoromethyl group, 1,1,1-trifluoroethyl group, 1,1,1-trichloroethyl group, a nonafluoro butyl group and the like. Examples of the aryl group as $R^{105}$ and $R^{106}$ may include: a phenyl group, an alkoxyphenyl group such as p-methoxyphenyl group, m-methoxyphenyl group, o-methoxyphenyl group, an ethoxyphenyl group, p-tert-butoxyphenyl group, m-tert-butoxyphenyl group or the like, an alkylphenyl groups such as 2-methylphenyl group, 3-methylphenyl group, 4-methylphenyl group, an ethylphenyl group, 4-tert-butylphenyl group, 4-butylphenyl group, a dimethylphenyl group or the like. Examples of the halogenated aryl group $R^{105}$ and $R^{106}$ may include: a fluorophenyl group, a chlorophenyl group, 1,2,3,4,5-pentafluoro phenyl group and the like. Examples of the aralkyl group $R^{105}$ and $R^{106}$ may include: a benzyl group, a phenethyl group, and the like.

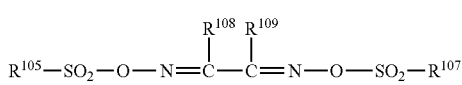

P3

(In the formula, $R^{107}$, $R^{108}$ and $R^{109}$ represent a linear, branched or cyclic alkyl group or halogenated alkyl group having 1 to 12 carbon atoms, an aryl group or a halogenated aryl group having 6 to 20 carbon atoms, or an aralkyl group having 7 to 12 carbon atoms. $R^{108}$ and $R^{109}$ may bond to each other to form a cyclic structure. When they form a cyclic structure, $R^{108}$ and $R^{109}$ each represents a linear or branched alkylene group having 1 to 6 carbon atoms. $R^{105}$ represents the same as that of the formula P2.)

Examples of the alkyl group, the halogenated alkyl group, the aryl group, the halogenated aryl group, and the aralkyl group as $R^{107}$, $R^{108}$ and $R^{109}$ may be the same as exemplified for $R^{105}$ and $R^{106}$. In addition, as an alkylene group for $R^{108}$ and $R^{109}$, a methylene group, an ethylene group, a propylene group, a butylene group, a hexylene group and the like may be exemplified.

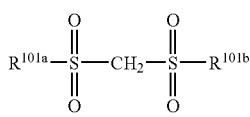

P4

(In the formula, $R^{101a}$ and $R^{101b}$ are the same as explained above.)

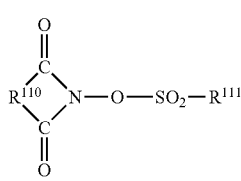

P5

(In the formula, $R^{110}$ represents an arylene group having 6–10 carbon atoms, an alkylene group having 1–6 carbon atoms or an alkenylene group having 2–6 carbon atoms. Some or all of hydrogen atoms of these groups may be further substituted with a linear, branched alkyl group or an alkoxy group having 1–4 carbon atoms, a nitro group, an acetyl group, or a phenyl group. $R^{111}$ represents a linear, branched or substituted alkyl group, alkenyl group or alkoxy alkyl group having 1–8 carbon atoms, a phenyl group or a naphthyl group. Some or all of hydrogen atoms of these groups may be substituted with an alkyl group or an alkoxy group having 1–4 carbon atoms; a phenyl group which may be substituted with an alkyl group or an alkoxy group having 1–4 carbon atoms, a nitro group or an acetyl group; a hetero aromatic group having 3–5 carbon atoms; or a chlorine atom or a fluorine atom.)

Examples of the arylene group as $R^{110}$ may include: 1,2-phenylene group, 1,8-naphtylene group and the like. Examples of the alkylene group may include: a methylene group, an ethylene group, a trimethylene group, a tetramethylene group, a phenylethylene group, a norbornane-2,3-di-yl group, and the like. Examples of the alkenylene group may include: 1,2-vinylene group, 1-phenyl-1,2-vinylene group, 5-norbornene-2,3-di-yl group and the like. Examples of the alkyl group as $R^{111}$ may be the same as exemplified for $R^{101a}$–$R^{101c}$. Examples of the alkenyl group as $R^{111}$ may include: a vinyl group, 1-propenyl group, an allyl group, 1-butenyl group, 3-butenyl group, an isoprenyl group, 1-pentenyl group, 3-pentenyl group, 4-pentenyl group, a dimethyl allyl group, 1-hexenyl group, 3-hexenyl group, 5-hexenyl group, 1-heptenyl group, 3-heptenyl group, 6-heptenyl group, 7-octenyl group and the like. Examples of the alkoxy alkyl group may include: a methoxy methyl group, an ethoxy methyl group, a propoxy methyl group, a butoxy methyl group, a pentyloxy methyl group, a hexyloxy methyl group, a heptyloxy methyl group, a methoxy ethyl group, an ethoxy ethyl group, a propoxy ethyl group, a butoxy ethyl group, pentyloxy ethyl group, a hexyloxy ethyl group, a methoxy propyl group, ethoxy propyl group, a propoxy propyl group, a butoxy propyl group, a methoxy butyl group, an ethoxy butyl group, a propoxy butyl group, a methoxy pentyl group, an ethoxy pentyl group, a methoxy hexyl group, a methoxy heptyl group and the like.

In addition, examples of the alkyl group having 1–4 carbon atoms which may be further substituted, a methyl group, an ethyl group, a propyl group, an isopropyl group, n-butyl group, an isobutyl group, a tert-butyl group and the like. Examples of the alkoxy group having 1–4 carbon atoms may include: a methoxy group, an ethoxy group, a propoxy group, an isopropoxy group, n-butoxy group, an isobutoxy group, a tert-butoxy group and the like. Examples of the phenyl group which may be substituted with an alkyl group and an alkoxy group having 1–4 carbon atoms, a nitro group or an acetyl group may include: a phenyl group, a tolyl group, p-tert-butoxy phenyl group, p-acetyl phenyl group, p-nitrophenyl group and the like. Examples of a hetero aromatic group having 3–5 carbon atoms may include: a pyridyl group, a furyl group and the like.

Illustrative examples of an acid generator may include: an onium salt such as diphenyl iodonium trifluoromethane sulfonate, (p-tert-butoxy phenyl) phenyl iodonium trifluoromethane sulfonate, diphenyl iodonium p-toluenesulfonate, (p-tert-butoxy phenyl) phenyl iodonium p-toluenesulfonate, triphenyl sulfonium trifluoromethane sulfonate, (p-tert-butoxy phenyl) diphenyl sulfonium trifluoromethane sulfonate, bis(p-tert-butoxy phenyl) phenyl sulfonium trifluoromethane sulfonate, tris (p-tert-butoxy phenyl) sulfonium trifluoromethane sulfonate, triphenyl sulfonium p-toluenesulfonate, (p-tert-butoxy phenyl) diphenyl sulfonium p-toluenesulfonate, bis(p-tert-butoxy phenyl) phenyl sulfonium p-toluenesulfonate, tris (p-tert-butoxy phenyl) sulfonium p-toluenesulfonate, triphenyl sulfonium nonafluoro butane sulfonate, triphenyl sulfonium butane sulfonate, trimethyl sulfonium trifluoromethane sulfonate, trimethyl sulfonium p-toluenesulfonate, cyclohexyl methyl (2-oxocyclohexyl) sulfonium trifluoromethane sulfonate, cyclohexyl methyl (2-oxo cyclohexyl) sulfonium p-toluenesulfonate, dimethyl phenyl sulfonium trifluoromethane sulfonate, dimethyl phenyl sulfonium p-toluenesulfonate, dicyclohexyl phenyl sulfonium trifluoromethane sulfonate, dicyclohexyl phenyl sulfonium p-toluenesulfonate, trinaphthylsulfonium trifluoromethane sulfonate, (2-norbonyl) methyl (2-oxocyclohexyl) sulfonium trifluoromethane sulfonate, ethylene bis [methyl (2-oxocyclopentyl) sulfonium trifluoromethane sulfonate], 1,2'-naphthyl carbonyl methyl tetrahydro thiophenium triflate and the like.

Examples of a diazomethane derivative may include: bis(benzene sulfonyl) diazomethane, bis(p-toluene sulfonyl) diazomethane, bis(xylene sulfonyl) diazomethane, bis(cyclohexyl sulfonyl) diazomethane, bis(cyclopentyl sulfonyl) diazomethane, bis(n-butylsulfonyl) diazomethane, bis (isobutyl sulfonyl) diazomethane, bis(sec-butylsulfonyl) diazomethane, bis(n-propylsulfonyl) diazomethane, bis(isopropyl sulfonyl) diazomethane, bis(tert-butyl sulfonyl) diazomethane, bis(n-amylsulfonyl) diazomethane, bis(isoamylsulfonyl) diazomethane, bis(sec-amylsulfonyl) diazomethane, bis(tert-amylsulfonyl) diazomethane, 1-cyclohexylsulfonyl-1-(tert-butyl sulfonyl) diazomethane, 1-cyclohexyl sulfonyl-1-(tert-amyl sulfonyl) diazomethane, 1-tert-amyl sulfonyl-1-(tert-butyl-sulfonyl) diazomethane and the like.

Examples of a glyoxime derivative may include: bis-O-(p-toluene sulfonyl)-α-dimethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione glyoxime, bis-O-(p-toluene sulfonyl)-2-methyl-3,4-pentanedione glyoxime, bis-O-(n-butane sulfonyl)-α-dimethylglyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-methyl-3,4-pentanedione glyoxime, bis-O-(methane sulfonyl)-α-dimethylglyoxime, bis-O-(trifluoromethane sulfonyl)-α-dimethylglyoxime, bis-O-(1,1,1-trifluoro ethane sulfonyl)-α-dimethylglyoxime, bis-O-(tert-butane sulfonyl)-α-dimethylglyoxime, bis-O-(perfluoro octane sulfonyl)-α-dimethylglyoxime, bis-O-(cyclohexane sulfonyl)-α-dimethylglyoxime, bis-O-(benzene sulfonyl)-α-dimethylglyoxime, bis-O-(p-fluorobenzene sulfonyl)-α-dimethylglyoxime, bis-O-(p-tert-butylbenzene sulfonyl)-α-dimethylglyoxime, bis-O-(xylene sulfonyl)-α-dimethylglyoxime, bis-O-(camphor sulfonyl)-α-dimethylglyoxime and the like.

Examples of a bissulfone derivative may include: bis naphthyl sulfonyl methane, bis-trifluoro methyl sulfonyl methane, bis methyl sulfonyl methane, bis ethyl sulfonyl methane, bis propyl sulfonyl methane, bis isopropyl sulfonyl methane, bis-p-toluene sulfonyl methane, bis benzene sulfonyl methane and the like.

Examples of the β-ketosulfone derivative may include: 2-cyclohexyl carbonyl-2-(p-toluene sulfonyl) propane, 2-isopropyl carbonyl-2-(p-toluene sulfonyl) propane and the like.

Examples of the disulfone derivative may include: diphenyl disulfone derivative, a dicyclohexyl disulfone derivative and the like.

Examples of the nitro benzyl sulfonate derivative may include: 2,6-dinitro benzyl p-toluenesulfonate, 2,4-dinitro benzyl p-toluenesulfonate, and the like.

Examples of the sulfonate derivative may include: 1,2,3-tris(methane sulfonyloxy) benzene, 1,2,3-tris(trifluoromethane sulfonyloxy) benzene, 1,2,3-tris(p-toluene sulfonyloxy) benzene, and the like.

Examples of the sulfonate derivative of N-hydroxy imide compound may include: N-hydroxy succinimide methane sulfonate, N-hydroxy succinimide trifluoromethane sulfonate, N-hydroxy succinimide ethane sulfonate, N-hydroxy succinimide 1-propane sulfonate, N-hydroxy succinimide 2-propane sulfonate, N-hydroxy succinimide 1-pentane sulfonate, N-hydroxy succinimide 1-octane sulfonate, N-hydroxy succinimide p-toluenesulfonate, N-hydroxy succinimide p-methoxybenzene sulfonate, N-hydroxy succinimide 2-chloroethane sulfonate, N-hydroxy succinimide benzenesulfonate, N-hydroxy succinimides-2,4,6-trimethyl benzene sulfonate, N-hydroxy succinimide 1-naphthalene sulfonate, N-hydroxy succinimide 2-naphthalene sulfonate, N-hydroxy-2-phenyl succinimide methane sulfonate, N-hydroxy maleimide methane sulfonate, N-hydroxy maleimide ethane sulfonate, N-hydroxy-2-phenyl maleimide methane sulfonate, N-hydroxy glutarimide methane sulfonate, N-hydroxy glutarimide benzenesulfonate, N-hydroxy phthalimide methane sulfonate, N-hydroxy phthalimide benzenesulfonate, N-hydroxy phthalimide trifluoromethane sulfonate, N-hydroxy phthalimide p-toluenesulfonate, N-hydroxy naphthalimide methane sulfonate, N-hydroxy naphthalimide benzenesulfonate, N-hydroxy-5-norbornene-2,3-dicarboxyimido methane sulfonate, N-hydroxy-5-norbornene-2,3-dicarboxyimido trifluoromethane sulfonate, N-hydroxy-5-norbornene-2,3-dicarboxyimid p-toluenesulfonate and the like.

Preferable examples thereof may include: an onium salt such as triphenyl sulfonium trifluoromethane sulfonate, (p-tert-butoxy phenyl) diphenyl sulfonium trifluoromethane sulfonate, tris(p-tert-butoxy phenyl) sulfonium trifluoromethane sulfonate, triphenyl sulfonium p-toluenesulfonate, (p-tert-butoxy phenyl) diphenyl sulfonium p-toluenesulfonate, tris (p-tert-butoxy phenyl) sulfonium p-toluenesulfonate, trinaphthylsulfonium trifluoromethane sulfonate, cyclohexyl methyl (2-oxocyclohexyl) sulfonium trifluoromethane sulfonate, (2-norbonyl)methyl (2-oxocyclohexyl) sulfonium trifluoromethane sulfonate, 1,2'-naphthyl carbonylmethyl tetrahydrothiophenium triflate, and the like;

a diazomethane derivative such as bis(benzene sulfonyl) diazomethane, bis(p-toluene sulfonyl) diazomethane, bis (cyclohexyl sulfonyl) diazomethane, bis(n-butylsulfonyl) diazomethane, bis(isobutyl sulfonyl) diazomethane, bis(sec-butylsulfonyl) diazomethane, bis(n-propyl sulfonyl) diazomethane, bis(isopropyl sulfonyl) diazomethane, bis(tert-butylsulfonyl) diazomethane and the like;

a glyoxime derivative, such as bis-O-(p-toluene sulfonyl)-α-dimethylglyoxime and bis-O-(n-butane sulfonyl)-α-dimethylglyoxime and the like;

a bissulfone derivative, such as bisnaphthyl sulfonyl methane and the like;

a sulfonate derivative of N-hydroxyimide compounds, such as N-hydroxy succinimide methane sulfonate, N-hydroxy succinimide trifluoromethane sulfonate, N-hydroxy succinimide 1-propane sulfonate, N-hydroxy succinimide 2-propane sulfonate, N-hydroxy succinimide 1-pentane sulfonate, N-hydroxy succinimide p-toluene sulfonate, N-hydroxy naphthalimide methane sulfonate and N-hydroxy naphthalimide benzene sulfonate and the like.

The above-mentioned acid generator may be used alone or in admixture. The onium salt is excellent to achieve straight wall profiles. The diazomethane derivative and the glyoxime derivative are excellent in an effect of reducing standing wave. Therefore, if both of them are combined, minute control of profile can be conducted.

An amount of the acid generator to be added is preferably 0.1 to 50 parts (parts by weight, hereinafter represents the same meaning), more preferably 0.5 to 40 parts to 100 parts of a base resin. If it is less than 0.1 parts, an amount of acid generated upon exposure is little, and sensitivity and resolution is degraded in some cases. If it more than 50 parts, transmittance of the resist is lowered, and resolution is degraded in some cases.

The dissolution inhibitor (dissolution control agent) blended in the positive resist composition of the present invention, especially chemically amplified positive resist composition may be a compound which has an average molecular weight of 100 to 1,000, preferably 150 to 800, and has two or more of phenolic hydroxyl group in a molecular wherein 0 to 100 mole % on average of hydrogens of the phenolic hydroxyl groups are substituted with an acid labile group, or a compound having carboxyl groups in a molecular wherein 50 to 100 mole % on average of hydrogens of the carboxyl groups are substituted with an acid labile group.

A substitution ratio of hydrogens of phenolic hydroxyl groups substituted with acid unstable group is 0 mole % or more, preferably 30 mole % or more on average to total phenolic hydroxyl group. The upper limit thereof is 100 mole %, preferably 80 mole %. A substitution ratio of hydrogen of carboxyl groups substituted with acid labile group is 50 mole % or more, preferably 70 mole % or more on average to total carboxyl group. The upper limit thereof is 100 mole %.

In this case, the compound having two or more phenolic hydroxyl groups or the compound having carboxyl groups may be those represented by the following formulae (D1) to (D14).

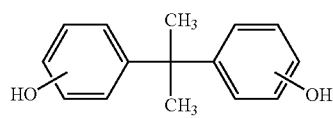
D1

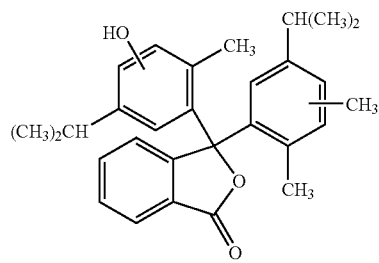
D2

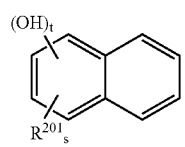
D3

-continued

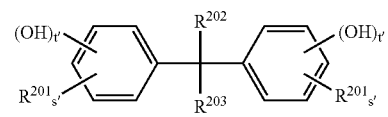
D4

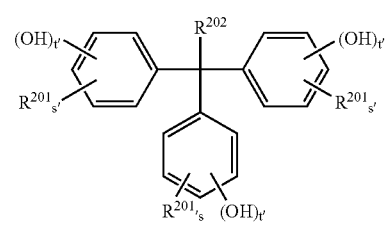
D5

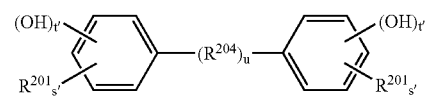
D6

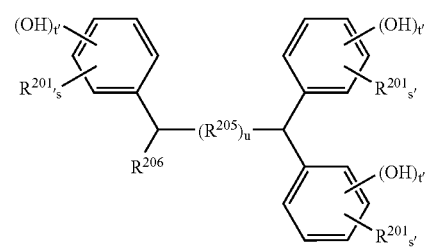
D7

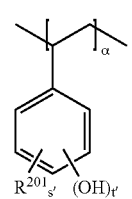
D8

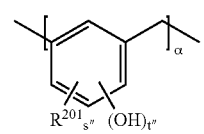
D9

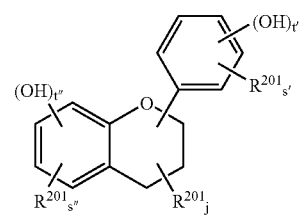
D10

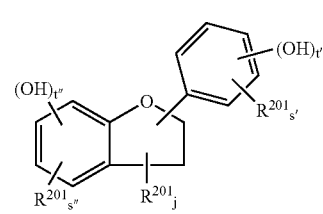
D11

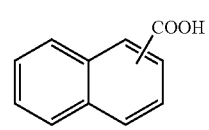
D12

-continued

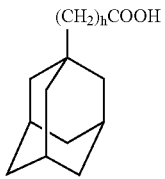
(CH$_2$)$_h$COOH

D13

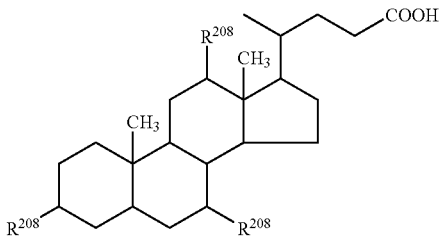

D14

In the formulae, R$^{201}$ and R$^{202}$ each represents a hydrogen or a linear or branched alkyl group or alkenyl group having 1–8 carbon atoms. R$^{203}$ represents a hydrogen or a linear or branched alkyl group or alkenyl group having 1–8 carbon atoms or —(R$^{207}$)$_h$COOH. R$^{204}$ represents —(CH$_2$)$_i$-(i=2 to 10), an arylene group having 6–10 carbon atoms, a carbonyl group, a sulfonyl group, an oxygen atom or a sulfur atom. R$^{205}$ represents an alkylene group having 1–10 carbon atoms, an arylene group having 6–10 carbon atoms, a carbonyl group, a sulfonyl group, an oxygen atom or a sulfur atom. R$^{206}$ represents a hydrogen or a linear or branched alkyl group or alkenyl group having 1–8 carbon atoms, or a phenyl group or a naphthyl group which are substituted with a hydroxyl group respectively. R$^{207}$ represents a linear or branched alkylene group having 1–10 carbon atoms. R$^{208}$ represents a hydrogen or a hydroxyl group. j is an integer of 0 to 5. u, h is 0 or 1. s, t, s', t', s", t" are the number satisfying the formulae: s+t=8, s'+t'=5, s"+t"=4, such that at least one hydroxyl group is contained in each of phenyl skeletons. α is the number such that a molecular weight of the compound represented by (D8) and (D9) may be 100 to 1000.

The weight average molecular weight of the above-mentioned compound is 100 to 1000, preferably 150 to 800. The amount of the dissolution inhibitor to be blended is 0 to 50 parts by weight, preferably 5 to 50 parts by weight, more preferably 10 to 30 parts by weight to 100 parts of the base resin. They can be used alone or in admixture. If the amount to be blended is too little, resolution cannot be improved in some cases. If it is too much, film loss of the pattern may be caused, and resolution tends to be degraded.

Furthermore, the basic compound can be blended in the positive resist composition of the present invention, especially in the chemically amplified positive resist composition.

Suitable compound as the basic compound is a compound which can suppress diffusion rate of the acid generated by acid generator when it is diffused in the resist film. If the basic compound is blended, the diffusion rate of the acid in the resist film can be suppressed, and thereby the resolution is improved, fluctuation of sensitivity after exposure can be suppressed, dependency on the substrate or on environment can be lowered, and exposure margin, pattern profile or the like can be improved.

Examples of such a basic compound may include: a primary, secondary and tertiary aliphatic amines, a mixed amine, an aromatic amine, a heterocyclic amine, a compound containing nitrogen which has a carboxyl group, a compound containing nitrogen which has a sulfonyl group, a compound containing nitrogen which has a hydroxyl group, a compound containing nitrogen which has a hydroxy phenyl group, an alcoholic compound containing nitrogen, an amide derivative, an imide derivative and the like.

Illustrative examples of the primary aliphatic amine may include: ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine and the like. Examples of the secondary aliphatic amine may include: dimethylamine, diethylamine, di-n-propylamine, diisopropyl amine, di-n-butylamine, diisobutylamine, di-sec-butylamine, dipentylamine, dicyclopentyl amine, dihexylamine, dicyclohexylamine, diheptylamine, dioctylamine, dinonylamine, didecylamine, didodecylamine, dicetylamine, N,N-dimethyl methylenediamine, N,N-dimethyl ethylenediamine, N,N-dimethyl tetraethylene pentamine and the like. Examples of the tertiary aliphatic amine may include: trimethylamine, triethylamine, tri-n-propylamine, triisopropylamine, tri-n-butylamine, tri-isobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetra methyl methylene diamine, N,N,N',N'-tetramethyl ethylenediamine, N,N,N',N'-tetramethyl tetraethylene pentamine and the like.

Examples of the mixed amines include: dimethylethyl amine, methylethylpropyl amine, benzyl amine, phenethyl amine, benzyl dimethyl amine or the like.

Examples of the aromatic amines and the heterocyclic amines may include: an aniline derivative (for example, aniline, N-methyl aniline, and N-ethyl aniline, N-propyl aniline, N,N-dimethylaniline, 2-methyl aniline, 3-methyl aniline, 4-methyl aniline, ethyl aniline, propyl aniline, trimethyl aniline, 2-nitroaniline, 3-nitroaniline, 4-nitroaniline, 2,4-dinitro aniline, 2,6-dinitro aniline, 3,5-dinitro aniline, N,N-dimethyl toluidine and the like), diphenyl (p-tolyl) amine, methyl diphenylamine, triphenylamine, phenylenediamine, naphthylamine, diamino naphthalene, a pyrrole derivative (for example, pyrrole, 2H-pyrrole, 1-methylpyrrole, 2,4-dimethylpyrrole, 2,5-dimethylpyrrole, N-methylpyrrole, and the like), oxazole derivatives (for example, oxazole, isoxazole and the like), a thiazoles derivative (for example, thiazole, isothiazole, and the like), an imidazole derivative (for example, imidazole, 4-methyl imidazole, 4-methyl-2-phenyl imidazole and the like), a pyrazole derivative, a furazane derivative, a pyrroline derivative (for example, pyrroline, 2-methyl-1-pyrroline and the like), a pyrrolidine derivative (for example, pyrrolidine, N-methylpyrrolidine, pyrrolidinone, N-methyl pyrrolidone and the like), an imidazoline derivative, an imidazolidine derivative, a pyridine derivative (for example, pyridine, methylpyridine, ethyl pyridine, propyl pyridine, butyl pyridine, 4-(1-butyl pentyl) pyridine, dimethylpyridine, trimethylpyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridone, 4-pyrrolidino pyridine, 1-methyl-4-phenyl pyridine, 2-(1-ethylpropyl) pyridine, amino pyridine, dimethyl amino pyridine and the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, a uracil derivative, a uridine derivative and the like.

Furthermore, examples of a compound containing nitrogen which has a carboxyl group may include: aminobenzoic acid, indole carboxylic acid, and an amino acid derivative (for example, nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, methoxy alanine) and the like. Examples of a compound containing nitrogen which has a sulfonyl group may include: 3-pyridine sulfonic acid, p-toluenesulfonic acid pyridinium and the like. Examples of a compound containing nitrogen which has a hydroxyl group, a compound containing nitrogen which has a hydroxy phenyl group, and an alcoholic compound containing nitrogen may include: 2-hydroxy pyridine, amino cresol, 2,4-quinoline diol, 3-indole methanol hydrate, monoethanolamine, diethanolamine, triethanolamine, N-ethyl diethanolamine, N,N-diethyl ethanolamine, triisopropanol amine, 2,2'-iminodiethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidino-1,2-propanediol, 3-pyrrolidino-1,2-propanediol, 8-hydroxy julolidine, 3-quinuclidinol, 3-tropanol, 1-methyl-2-pyrrolidine ethanol, 1-aziridine ethanol, N-(2-hydroxyethyl) phthalimide, N-(2-hydroxyethyl) isonicotinamide, and the like.

Examples of an amide derivative may include: formamide, N-methyl formamide, N,N-dimethylformamide, acetamide, N-methyl acetamide, N,N-dimethylacetamide, propionamide, benzamide, and the like.

Examples of an imide derivative may include: phthalimide, succinimide, maleimide, or the like.

Furthermore, one or more selected from the basic compound represented by following general formula (B)-1 can also be added.

$N(X)_n(Y)_{3-n}$ (B)-1

(In the formula, n is 1, 2, or 3. The side chain X may be the same or different, and represents the following general formulae (X)-1 to (X)-3. The side chain Y may be the same or different, and represents a hydrogen atom or a linear, branched or cyclic alkyl group having 1–20 carbon atoms which may comprise an ether group or a hydroxyl group. Moreover, X may bond to each other and form a ring.)

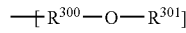
(X)-1

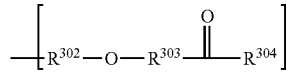
(X)-2

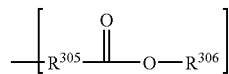
(X)-3

In the formula, $R^{300}$, $R^{302}$, and $R^{305}$ represent a linear or branched alkylene group having 1–4 carbon atoms, and $R^{301}$ and $R^{304}$ represent a hydrogen atom or a linear, branched or cyclic alkyl group having 1–20 carbon atoms, which may comprise one or more of a hydroxy group, an ether group, an ester group, and a lactone ring.

$R^{303}$ represents a single bond, or a linear or branched alkylene group having 1–4 carbon atoms, $R^{306}$ represents a linear, branched or cyclic alkyl group having 1–20 carbon atoms, which may contain one or more of a hydroxy group, an ether group, an ester group, and a lactone ring.

Illustrative examples of the compound represented by the general formula (B)-1 may be as follows:

Tris(2-methoxy methoxy ethyl)amine, tris{2-(2-methoxyethoxy)ethyl}amine, tris{2-(2-methoxy ethoxy methoxy)ethyl}amine, tris{2-(1-methoxyethoxy)ethyl}amine, tris{2-(1-ethoxy ethoxy)ethyl}amine, tris{2-(1-ethoxy propoxy)ethyl}amine, tris[2-{2-(2-hydroxy ethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclo octadecane, 1-aza-12-crown-4,1-aza-15-crown-5,1-aza-18-crown-6, tris (2-formyloxy-ethyl)amine, tris(2-acetoxy ethyl)amine, tris (2-propionyloxy-ethyl)amine, tris(2-butylyloxy-ethyl)amine, tris(2-isobutyryl oxy-ethyl)amine, tris(2-valeryloxy-ethyl)amine, tris(2-pivaloyloxy-ethyl)amine, N,N-bis(2-acetoxy ethyl) 2-(acetoxyacetoxy)ethylamine, tris(2-methoxycarbonyl oxy-ethyl)amine, tris(2-tert-butoxy carbonyl oxy-ethyl)amine, tris[2-(2-oxo propoxy)ethyl]amine, tris[2-(methoxycarbonyl methyl)oxy-ethyl]amine, tris[2-(tert-butoxycarbonylmethyloxy)ethyl]amine, tris[2-(cyclohexyloxy carbonylmethyloxy)ethyl]amine, tris(2-methoxycarbonyl ethyl)amine, tris(2-ethoxy carbonyl ethyl)amine, N,N-bis(2-hydroxy ethyl) 2-(methoxycarbonyl)ethylamine, N,N-bis(2-acetoxy ethyl) 2-(methoxycarbonyl)ethylamine, N,N-bis(2-hydroxy ethyl) 2-(ethoxy carbonyl)ethylamine, N,N-bis(2-acetoxy ethyl) 2-(ethoxy carbonyl)ethylamine, N,N-bis(2-hydroxy ethyl) 2-(2-methoxy ethoxy carbonyl)ethylamine, N,N-bis(2-acetoxy ethyl) 2-(2-methoxy ethoxy carbonyl)ethylamine, N,N-bis(2-hydroxy ethyl) 2-(2-hydroxy ethoxy carbonyl)ethylamine, N,N-bis(2-acetoxy ethyl) 2-(2-acetoxy ethoxy carbonyl)ethylamine, N,N-bis(2-hydroxy ethyl) 2-[(methoxycarbonyl)methoxycarbonyl]ethylamine, N,N-bis(2-acetoxy ethyl) 2-[(methoxycarbonyl)methoxycarbonyl]ethylamine, N,N-bis(2-hydroxy ethyl) 2-(2-oxo propoxy carbonyl)ethylamine, N,N-bis(2-acetoxy ethyl) 2-(2-oxo propoxy carbonyl)ethylamine, N,N-bis(2-hydroxy ethyl) 2-(tetrahydro furfuryl oxy-carbonyl)ethylamine, N,N-bis(2-acetoxy ethyl) 2-(tetrahydro furfuryl oxy-carbonyl)ethylamine, N,N-bis(2-hydroxy ethyl) 2-[(2-oxo tetrahydrofuran-3-yl)oxy-carbonyl]ethylamine, N,N-bis(2-acetoxy ethyl) 2-[(2-oxo-tetrahydrofuran-3-yl)oxy-carbonyl]ethylamine, N,N-bis(2-hydroxy ethyl) 2-(4-hydroxy butoxy carbonyl)ethylamine, N,N-bis (2-formyl oxy-ethyl) 2-(4-formyloxybutoxy carbonyl)ethylamine, N,N-bis(2-formyl oxy-ethyl) 2-(2-formyloxy ethoxy carbonyl)ethylamine, N,N-bis(2-methoxy ethyl) 2-(methoxycarbonyl)ethylamine, N-(2-hydroxy ethyl)bis[2-(methoxycarbonyl)ethyl]amine, N-(2-acetoxy ethyl)bis[2-(methoxycarbonyl)ethyl]amine, N-(2-hydroxy ethyl)bis[2-

(ethoxy carbonyl)ethyl]amine, N-(2-acetoxy ethyl)bis[2-(ethoxy carbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxy ethyl)bis[2-(methoxycarbonyl)ethyl]amine, N-butylbis[2-(methoxycarbonyl)ethyl]amine, N-butylbis[2-(2-methoxy ethoxy carbonyl)ethyl]amine, N-methyl bis(2-acetoxy ethyl)amine, N-ethyl bis(2-acetoxy ethyl)amine, N-methyl bis(2-pivaloyloxy-ethyl)amine, N-ethyl bis[2-(methoxy carbonyloxy)ethyl]amine, N-ethyl bis[2-(tert-butoxycarbonyloxy)ethyl]amine, tris(methoxycarbonyl methyl)amine, tris(ethoxy carbonyl methyl)amine, N-butyl bis(methoxycarbonyl methyl)amine, N-hexyl bis(methoxycarbonyl methyl)amine, and β-(diethylamino)-δ-valerolactone. However they are not limited thereto.

Furthermore, one or more kinds of a basic compound with a cyclic structure represented in following general formula (B)-2 can also be added.

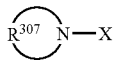

(B)-2

(In the formula, X represents the same as explained above, $R^{307}$ represents a linear or branched alkylene group having 2–20 carbon atoms, which may comprise one or more of a carbonyl group, an ether group, an ester group, or a sulfide.)

Illustrative examples of (B)-2 may include: 1-[2-(methoxy methoxy)ethyl]pyrrolidine, 1-[2-(methoxy methoxy)ethyl]piperidine, 4-[2-(methoxy methoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidino ethyl acetate, 2-morpholino ethyl acetate, 2-(1-pyrrolidinyl)ethyl formate, 2-piperidino ethyl propionate, 2-morpholino ethyl acetoxy acetate, 2-(1-pyrrolidinyl)ethyl methoxy acetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidino propionate, methyl 3-morpholino propionate, methyl 3-(thiomorpholino)propionate, methyl 2-methyl-3-(1-pyrrolidinyl)propionate, ethyl 3-morpholino propionate, methoxycarbonyl methyl 3-piperidino propionate, 2-hydroxy ethyl 3-(1-pyrrolidinyl)propionate, 2-acetoxy ethyl 3-morpholino propionate, 2-oxo tetrahydrofuran-3-yl3-(1-pyrrolidinyl)propionate, tetrahydrofurfuryl 3-morpholino propionate, glycidyl 3-piperidino propionate, 2-methoxy ethyl 3-morpholino propionate, 2-(2-methoxyethoxy)ethyl 3-(1-pyrrolidinyl)propionate, butyl 3-morpholino propionate, cyclohexyl 3-piperidino propionate, α-(1-pyrrolidinyl)methyl-γ-butyrolactone, β-piperidino-γ-butyrolactone, β-morpholino-δ-valerolactone, methyl 1-pyrrolidinyl acetate, methyl piperidino acetate, methyl morpholino acetate, methyl thio morpholino acetate, ethyl 1-pyrrolidinyl acetate, 2-methoxy ethyl morpholino acetate, and the like.

Furthermore, the basic compound comprising a cyano group represented by the general formulae (B)-3 to (B)-6 can be added.

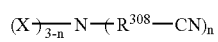

(B)-3

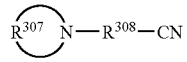

(B)-4

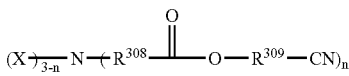

(B)-5

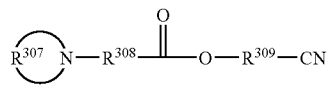

(B)-6

(In the formulae, X, $R^{307}$, and n are the same as explained above, $R^{308}$ and $R^{309}$ are the same or different and represent a linear or branched alkylene group having 1–4 carbon atoms.)

The basic compound comprising a cyano group specifically 3-(diethylamino)propiononitrile, N,N-bis(2-hydroxy ethyl)-3-amino propiononitrile, N,N-bis(2-acetoxy ethyl)-3-amino propiononitrile, N,N-bis(2-formyl oxy-ethyl)-3-amino propiononitrile, N,N-bis(2-methoxy ethyl)-3-amino propiononitrile, N,N-bis[2-(methoxy methoxy)ethyl]-3-amino propiononitrile, methyl N-(2-cyanoethyl)-N-(2-methoxy ethyl)-3-amino propionate, methyl N-(2-cyanoethyl)-N-(2-hydroxy ethyl)-3-amino propionate, methyl N-(2-acetoxy ethyl)-N-(2-cyanoethyl)-3-amino propionate, N-(2-cyanoethyl)-N-ethyl-3-amino propiononitrile, N-(2-cyanoethyl)-N-(2-hydroxy ethyl)-3-amino propiononitrile, N-(2-acetoxy ethyl)-N-(2-cyanoethyl)-3-amino propiononitrile, N-(2-cyanoethyl)-N-(2-formyl oxy-ethyl)-3-amino propiononitrile, N-(2-cyanoethyl)-N-(2-methoxy ethyl)-3-amino propiononitrile, N-(2-cyanoethyl)-N-[2-(methoxy methoxy)ethyl]-3-amino propiononitrile, N-(2-cyanoethyl)-N-(3-hydroxy-1-propyl)-3-amino propiononitrile, N-(3-acetoxy-1-propyl)-N-(2-cyanoethyl)-3-amino propiononitrile, N-(2-cyanoethyl)-N-(3-formyloxy-1-propyl)-3-amino propiononitrile, N-(2-cyanoethyl)-N-tetrahydrofurfuryl-3-amino propiononitrile, N,N-bis(2-cyanoethyl)-3-amino propiononitrile, diethyl amino acetonitrile, N,N-bis(2-hydroxy ethyl)amino acetonitrile, N,N-bis(2-acetoxy ethyl)amino acetonitrile, N,N-bis(2-formyl oxy-ethyl)amino acetonitrile, N,N-bis(2-methoxy ethyl)amino acetonitrile, N,N-bis[2-(methoxy methoxy)ethyl]amino acetonitrile, methyl N-cyanomethyl-N-(2-methoxy ethyl)-3-amino propionate, methyl N-cyanomethyl-N-(2-hydroxy ethyl)-3-amino propionate, methyl N-(2-acetoxy ethyl)-N-cyanomethyl-3-amino propionate, N-cyanomethyl-N-(2-hydroxy ethyl)amino acetonitrile, N-(2-acetoxy ethyl)-N-(cyanomethyl)amino acetonitrile, N-cyanomethyl-N-(2-formyloxy-ethyl)amino acetonitrile, N-cyanomethyl-N-(2-methoxy ethyl)amino acetonitrile, N-cyanomethyl-N-[2-(methoxy methoxy)ethyl]amino acetonitrile, N-(cyanomethyl)-N-(3-hydroxy-1-propyl)amino acetonitrile, N-(3-acetoxy-1-propyl)-N-(cyanomethyl)amino acetonitrile, N-cyanomethyl-N-(3-formyloxy-1-propyl)amino acetonitrile, N,N-bis(cyanomethyl)amino acetonitrile, 1-pyrrolidine propiononitrile, 1-piperidine propiononitrile, 4-morpholine propiononitrile, 1-pyrrolidine acetonitrile, 1-piperidine acetonitrile, 4-morpholine acetonitrile, cyanomethyl 3-diethyl amino propionate, cyanomethyl N,N-bis(2-hydroxyethyl)-3-amino propionate, cyanomethyl N,N-bis(2-acetoxy ethyl)-3-amino propionate, cyanomethyl N,N-bis(2-formyloxy-ethyl)-3-amino propionate, cyanomethyl N,N-bis(2-methoxy ethyl)-3-amino propionate, cyanomethyl N,N-bis[2-(methoxy methoxy)ethyl]-3-amino propionate, (2-cyanoethyl) 3-diethyl amino propionate, (2-cyanoethyl) N,N-bis(2-hydroxy ethyl)-3-amino propionate, (2-cyanoethyl) N,N-bis(2-acetoxyethyl)-3-amino propionate, (2-cyanoethyl) N,N-bis(2-formyl oxy-ethyl)-3-amino propionate, (2-cyanoethyl) N,N-bis(2-methoxy ethyl)-3-amino propionate, (2-cyanoethyl) N,N-bis[2-(methoxy methoxy)ethyl]-3-amino propionate, cyanomethyl 1-pyrrolidine propionate, cyanomethyl 1-piperidine propionate, cyanomethyl 4-morpholine propionate, (2-cyanoethyl) 1-pyrrolidine propionate, (2-cyanoethyl) 1-piperidine propionate, (2-cyanoethyl) 4-morpholine propionate, and the like.

The blending amount of the basic compound in the resist composition of the present invention is preferably 0.001 to 2 parts, especially 0.01 to 1 parts to 100 parts (by weight) of the total base resin. If the amount is less than 0.001 parts, blending effect is not brought out. If the blending amount is more than 2 parts, sensitivity may be degraded too much.

As a compound which has the group represented by ≡C—COOH in the molecule which can be added into the composition of the present invention, for example, one or more kinds of compounds selected from the following I group and II group can be used, but it is not limited thereto. By blending this component, PED (Post Exposure Delay) stability of a resist, and edge roughness on a nitride board are improved.

[I Group]

The compounds wherein some or all hydrogen atoms of phenolic hydroxyl groups of the compound represented by following general formulae (A1)–(A10) are substituted with —$R^{401}$—COOH ($R^{401}$ is a linear or branched alkylene group having 1–10 carbon atoms), and a mole ratio of the phenolic hydroxyl group (C) and the group (D) represented by ≡C—COOH in a molecule is as follows: C/(C+D)=0.1 to 1.0.

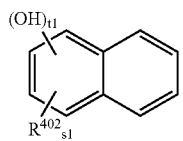

A1

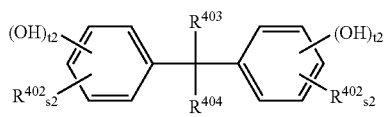

A2

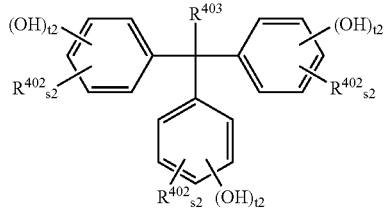

A3

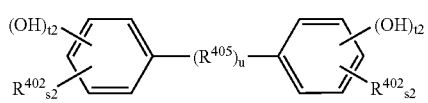

A4

-continued

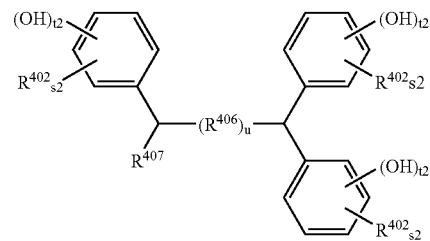

A5

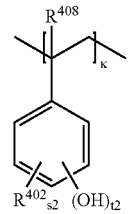

A6

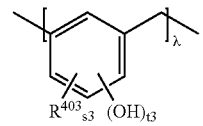

A7

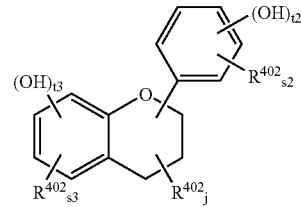

A8

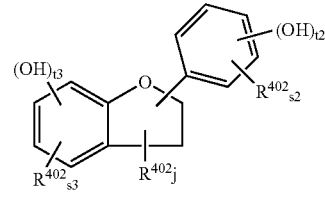

A9

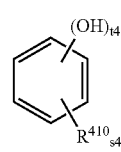

A10

In the formulae, $R^{408}$ represents a hydrogen atom or a methyl group. $R^{402}$ and $R^{403}$ independently represent a hydrogen atom or a linear or branched alkyl group or alkenyl group having 1–8 carbon atoms. $R^{404}$ represents a hydrogen atom or a linear or branched alkyl group or alkenyl group having 1–8 carbon atoms, or —$(R^{409})_h$—COOR' (R' is a hydrogen atom or —$R^{409}$—COOH). $R^{405}$ represents —$(CH_2)_i$— (i=2–10), an arylene group having 6–10 carbon atoms, a carbonyl group, a sulfonyl group, an oxygen atom, or a sulfur atom. $R^{406}$ represents an alkylene group having 1–10 carbon atoms, an arylene group having 6–10 carbon atoms, a carbonyl group, a sulfonyl group, an oxygen atom, or a sulfur atom. $R^{407}$ represents a hydrogen atom or a linear or branched alkyl group or alkenyl group having 1–8 carbon atoms, a phenyl group or a naphthyl group substituted with a hydroxyl group. $R^{409}$ represents a linear or branched alkyl group or alkenyl group having 1–10 carbon atoms, or a —$R^{411}$—COOH group. $R^{410}$ represents a hydrogen atom or a linear or branched alkyl group or alkenyl group having 1–8 carbon atoms, or —$R^{411}$—COOH group. $R^{411}$ represents a linear or branched alkylene group having 1–10 carbon atoms. h is an integer of 1–4. j is the number of 0 to 3. Each of s1 to s4 and t1 to t4 satisfies s1+t1=8, s2+t2=5, s3+t3=4, and s4+t4=6, and is the number so that at least one hydroxyl group exists in each phenyl skeleton. u is an integer of 1 to 4. κ is the number so that the weight average molecular weight of the compound represented by the formula (A6) falls within the range of 1,000–5,000. λ is the number so that the weight average molecular weight of the compound represented by the formula (A7) falls within the range of 1,000–10,000.

[II Group]

The compounds represented by following general formulae (A11)–(A15).

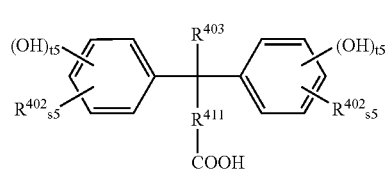
A11

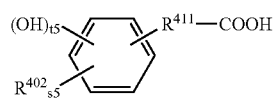
A12

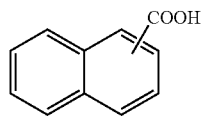
A13

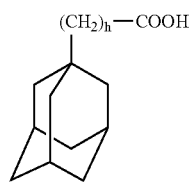
A14

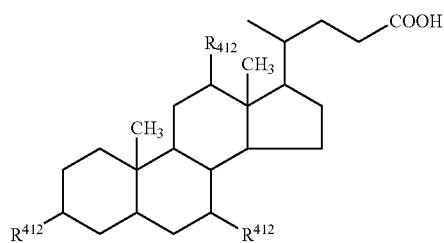
A15

In the formulae, $R^{402}$, $R^{403}$, and $R^{411}$ represent the same meaning as explained above. $R^{412}$ represents a hydrogen atom or a hydroxyl group. s5 and t5 are the number which satisfy: s5≧0, t5≧0, and s5+t5=5. h' is 0 or 1.

Illustrative examples of the above compounds may include compounds represented by following general formulae AI-1–14 and AII-1–10. However, it is not limited thereto.

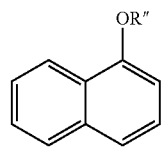
AI-1

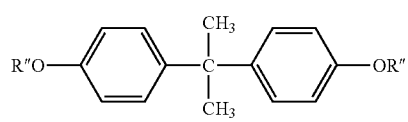
AI-2

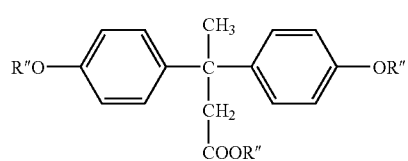
AI-3

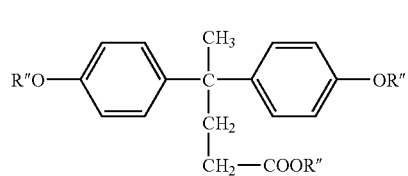
AI-4

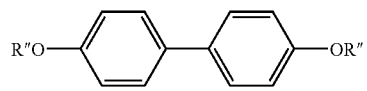
AI-5

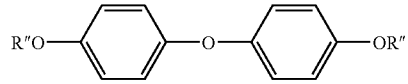
AI-6

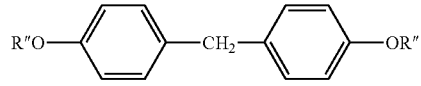
AI-7

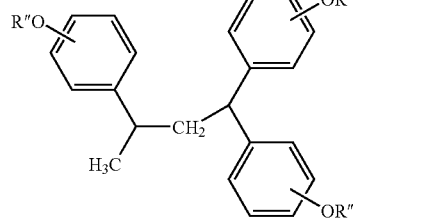
AI-8

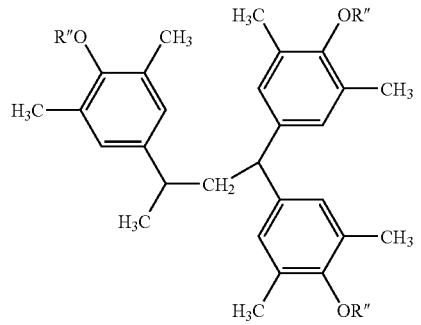
AI-9

-continued

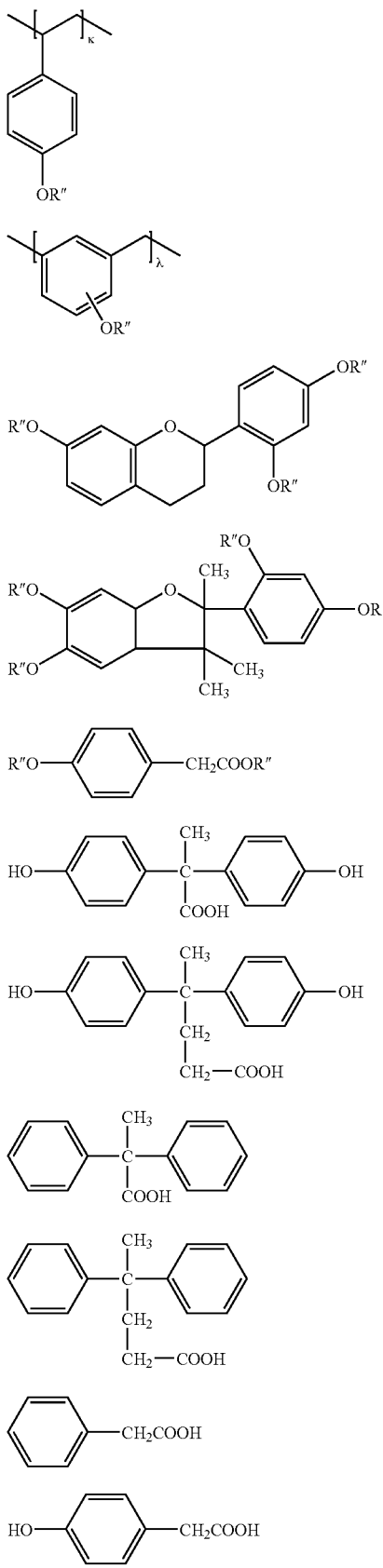

AI-10
AI-11
AI-12
AI-13
AI-14
AII-1
AII-2
AII-3
AII-4
AII-5
AII-6

-continued

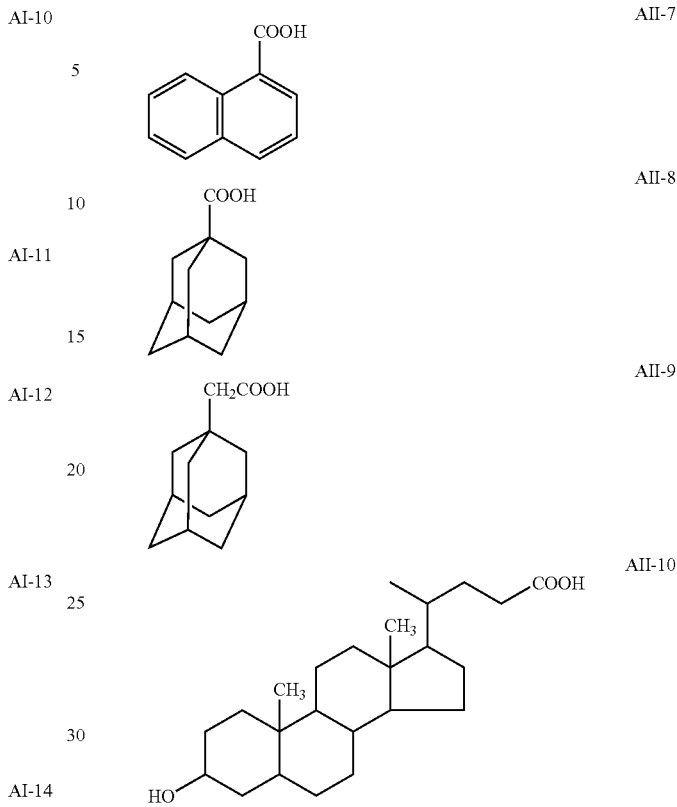

AII-7
AII-8
AII-9
AII-10

In the forumlae, R" represents a hydrogen atom or a $CH_2COOH$ group, and 10–100-mole % of R" is a $CH_2COOH$ group in each compound. κ and λ show the same meaning as mentioned above.

An addition amount of the compound which has the group represented by ≡C—COOH in the above-mentioned molecule is 0 to 5 parts, preferably 0.1 to 5 parts, more preferably 0.1 to 3 parts, still more preferably 0.1 to 2 parts to 100 parts (by weight) of the base resin. If it is more than 5 parts, a resolution of the resist composition may be degraded in some cases.

The surfactant can be further added to the positive resist composition of the present invention, especially to the chemically amplified positive resist composition for improving an application property or the like.

The surfactant is not limitative. Examples thereof may include: nonionic surfactants such as polyoxyethylene alkyl ethers, such as polyoxyethylene lauryl ether, polyethylene stearyl ether, polyoxyethylene cetyl ether, polyoxyethylene olein ether or the like; polyoxyethylene alkyl aryl ethers such as polyoxyethylene octyl-phenol ether, polyoxyethylene nonyl phenol or the like; polyoxyethylene polyoxy propylene block copolymers; sorbitan fatty acid esters such as sorbitan monolaurate, sorbitan monopalmitate, sorbitan monostearate or the like; polyoxyethylene sorbitan fatty acid esters such as polyoxyethylene sorbitan monolaurates, polyoxyethylene sorbitan monopalmitate, polyoxyethylene sorbitanmonostearate, polyoxyethylene sorbitan trioleate, polyoxyethylene sorbitan tristearate; fluorinated surfactants such as EFTOP EF301, EF303 and EF352 (Tochem), MEGAFACE F171, F172, and F173 (manufactured by Dainippon Ink Industry), Fluorad FC-430, FC-431 (manufactured by Sumitomo 3M), Asahiguard AG710, Surflon S-381, S-382, SC101, SC102, SC103, SC104, SC105 and SC106, Surfynol E1004, KH-10, KH-20, KH-30 and KH-40 (manufactured by Asahi Glass Co., Ltd.), and the like, organo siloxane polymer KP-341, X-70-092, X-70-093 (manufactured by Shin-Etsu Chemical Co., Ltd.), acrylic or methacrylic POLYFLOW No. 75, No. 95 (KYOEISHA CHEMICAL), or the like. Preferably, FC430, Surflon S-381, Surfynol E1004, KH-20 and KH-30 are exemplified. These can be used alone or in combination of two or more of them.

An amount of the surfactant to be added in the positive resist composition of the present invention, especially chemically amplified positive resist composition, is 2 parts by weight or less, preferably one parts by weight or less to 100 parts by weight of solid content in the resist composition.

In the case of using the positive resist composition of the present invention, especially the chemically amplified positive resist composition containing organic solvent, the polymer which has the repeating unit represented by the general formula (1a), and the repeating unit represented by the general formula (1b) and/or the repeating unit represented by the general formula (1c), and an acid generator or the like for manufacture of various integrated circuit, known lithography technique can be used. However, it is not limited thereto.

For example, the resist composition of the present invention is coated on the substrate for manufacture of integrated circuit (Si, $SiO_2$, SiN, SiON, TiN, WSi, BPSG, SOG, an organic antireflection coating, Cr, CrO, CrON, MoSi, or the like), by an appropriate coating such as spin coating, roll coating, flow coating, DIP coating, spray coating, doctor coating, or the like so that the thickness of the coating film is 0.1 to 2.0 μm, and is prebaked on a hot plate at 60 to 150° C. for 1 to 10 minutes, preferably at 80–120° C. for 1 to 5 minutes. Subsequently, the intended pattern is exposed through a predetermined mask with light source chosen from ultraviolet ray, far ultraviolet ray, electron beam, X-ray, excimer laser, γ ray, synchrotron-radiation or the like, preferably at an exposure wavelength of 300 nm or less, more preferably at an exposure wavelength in the range of 180 to 200 nm. The exposure dose is about 1–200 mJ/cm², preferably about 10–100 mJ/cm². Next, post exposure baking (PEB) is conducted at 60–150° C. for 1 to 5 minutes, preferably at 80–120° C. for 1–3 minutes on a hot plate.

Furthermore, the target pattern is preferably formed on a substrate by developing with a developer of an aqueous alkaline solution such as 0.1 to 5%, preferably 2–3% tetramethylammonium hydroxide (TMAH) or the like for 0.1–3 minutes, preferably for 0.5–2 minutes according to a conventional method, such as the dip method, the puddle method, the spray method or the like. In addition, the resist composition of the present invention is suitable for micropatterning especially with a high-energy beam such as a far ultraviolet ray at a wavelength of 254–193 nm, a vacuum ultraviolet radiation at a wavelength of 157 nm, electron beam, soft X ray, X-ray, excimer laser, γ ray, synchrotron-radiation, among high energy beam, preferably with a high-energy beam at a wavelength of 180–200 nm.

Moreover, the resist composition of the present invention can also be applied to immersion lithography. In ArF immersion lithography, deionized water is used as an immersion solvent. In the immersion lithography, exposure is conducted with inserting water between the pre-baked resist film and a projection lens. The exposure wavelength is 135 nm which is the value divided with 1.43 as an index of refraction of water at a wavelength of 193 nm, and it comes possible to use shorter wavelength. It is an important technology for carrying on ArF lithography as long as the advent of 65 nm node, and the development thereof has been accelerated. The lactone ring which has been used conventionally as a hydrophilic group of ArF resist has a solubility in both an aqueous alkaline solution and water. When a lactone with high solubility to water or an acid anhydride such as maleic anhydride or itaconic anhydride are used as a hydrophilic group, water infiltrates from the surface of resist by immersion in water, and it causes a problem that the surface of the resist is swelled. However, it is considered that influence of dissolution and swelling due to the above-mentioned immersion is small, since hexafluoro alcohol is dissolved in an aqueous alkaline solution, but it is not dissolved in water at all.

EXAMPLES

Although Synthetic examples, Comparative synthetic examples, Examples, and Comparative example will be shown and the present invention will be explained in detail hereafter, the present invention is not restricted to the following Examples.

Synthetic Example 1

To 100 mL flask were added 8.2 g of methacrylic acid-3-ethyl-3-exotetracyclo[$4.4.0.1^{2,5}.1^{7,10}$]dodecanyl, 11.1 g of methacrylic acid 5-oxo-4-oxatricyclo[$4.2.1.0^{3,7}$]nonane-2-yl, 7.2 g of methacrylic acid 5-[3,3,3-trifluoro-2-hydroxy-2-trifluoromethyl propyl]bicyclo[2.2.1]hept-2-yl and 20 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 22.1 g of white polymer was obtained.

The obtained polymer was analyzed by $^{13}C$, $^{1}H$-NMR and GPC measurement, and the following results were obtained.

Copolymerization ratio methacrylic acid-3-ethyl-3-exotetracyclo[$4.4.0.1^{2,5}.1^{7,10}$]dodecanyl:methacrylic acid 5-oxo-4-oxatricyclo[$4.2.1.0^{3,7}$]nonane-2-yl:methacrylic acid 5-[3,3,3-trifluoro-2-hydroxy-2-trifluoromethyl propyl]bicyclo[2.2.1]hept-2-yl=0.28:0.52:0.20

Mass average-molecular-weight (Mw)=9,800

Molecular weight distribution (Mw/Mn)=1.88

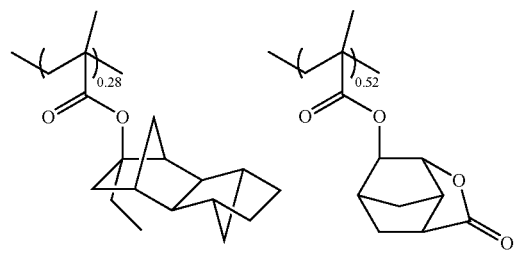

polymer1

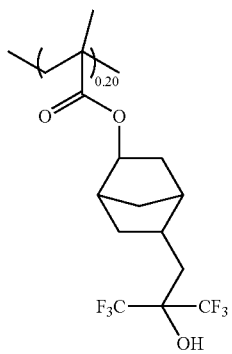

This polymer is defined as Polymer 1.

Synthetic Example 2

To 100 mL flask were added 9.5 g of methacrylic acid-3-ethyl-3-exotetracyclo[4.4.0.1^{2,5}.1^{7,10}]dodecanyl, 10.0 g of methacrylic acid 3-oxo-2,7-dioxa-tricyclo[4.2.1.0^{4,8}]-9-nonyl, 7.2 g of methacrylic acid 5-[3,3,3-trifluoro-2-hydroxy-2-trifluoromethylpropyl bicyclo[2.2.1]hept-2-yl and 20 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 21.3 g of white polymer was obtained.

The obtained polymer was analyzed by $^{13}$C, $^1$H-NMR and GPC measurement, and the following results were obtained.

Copolymerization ratio methacrylic acid-3-ethyl-3-exotetracyclo[4.4.0.1^{2,5}.1^{7,10}]dodecanyl:methacrylic acid 3-oxo-2,7-dioxatricyclo[4.2.1.0^{4,8}]-9-nonyl:methacrylic acid 5-[3,3,3-trifluoro-2-hydroxy-2-trifluoromethyl propyl]bicyclo[2.2.1]hept-2-yl=0.35:0.45:0.20

Mass average-molecular-weight (Mw)=9,200

Molecular weight distribution (Mw/Mn)=1.71

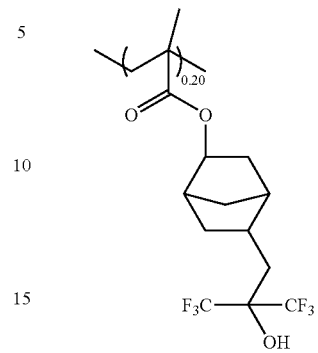

This polymer is defined as Polymer 2.

Synthetic Example 3

To 100 mL flask were added 6.4 g of exo-form methacrylic acid 2-ethylbicyclo[2.2.1]heptane-2-yl, 10.8 g of methacrylic acid-3-hydroxy-1-adamantyl, 7.2 g of methacrylic acid 5-[3,3,3-trifluoro-2-hydroxy-2-trifluoromethyl propyl]bicyclo[2.2.1]hept-2-yl and 20 g of tetrahydrofuran as a solvent. This vessel was cooled to −70° C. under nitrogen atmosphere, and degasing under reduced pressure and flowing of nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 20.0 g of white polymer was obtained.

The obtained polymer was analyzed by $^{13}$C, $^1$H-NMR and GPC measurement, and the following results were obtained.

Copolymerization ratio methacrylic acid 2-ethylbicyclo[2.2.1]heptane-2-yl:methacrylic acid-3-hydroxy-1-adamantyl:methacrylic acid 5-[3,3,3-trifluoro-2-hydroxy-2-trifluoromethyl propyl]bicyclo[2.2.1]hept-2-yl=0.31:0.46:0.23

Mass average-molecular-weight (Mw)=10,600

Molecular weight distribution (Mw/Mn)=1.77

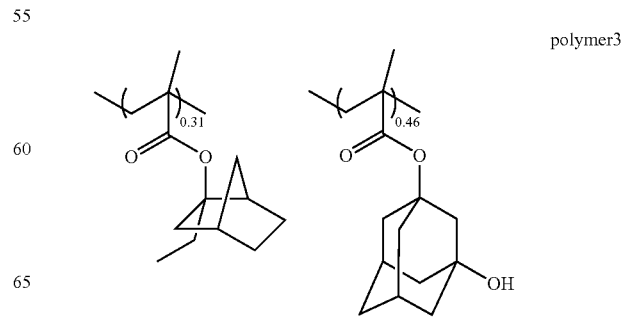

polymer3

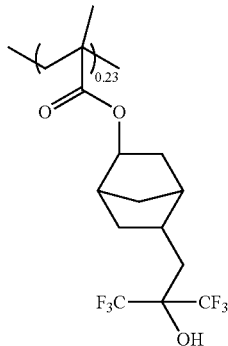

This polymer is defined as Polymer 3.

Synthetic Example 4

To 100 mL flask were added 9.2 g of methacrylic acid-3-ethyl-3-exotetracyclo[4.4.0.1$^{2,5}$.1$^{7,10}$]dodecanyl, 8.9 g of methacrylic acid-3-hydroxy-1-adamantyl, 10.8 g of methacrylic acid 5-[3,3,3-trifluoro-2-hydroxy-2-trifluoromethyl-propyl]bicyclo[2.2.1]hept-2-yl and 20 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 23.6 g of white polymer was obtained.

The obtained polymer was analyzed by $^{13}$C, $^{1}$H-NMR and GPC measurement, and the following results were obtained.

Copolymerization ratio methacrylic acid-3-ethyl-3-exotetracyclo[4.4.0.1$^{2,5}$.1$^{7,10}$]dodecanyl:methacrylic acid-3-hydroxy-1-adamantyl:methacrylic acid 5-[3,3,3-trifluoro-2-hydroxy-2-trifluoromethyl propyl]bicyclo[2.2.1]hept-2-yl=0.33:0.37:0.30

Mass average-molecular-weight (Mw)=8,200
Molecular weight distribution (Mw/Mn)=1.68

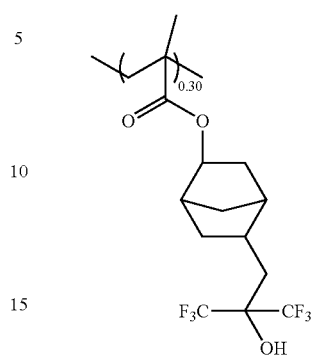

This polymer is defined as Polymer 4.

Synthetic Example 5

To 100 mL flask were added 9.2 g of methacrylic acid-3-ethyl-3-exotetracyclo[4.4.0.1$^{2,5}$.1$^{7,10}$]dodecanyl, 11.5 g of methacrylic acid-3-hydroxy-1-adamantyl, 11.8 g of vinyl ether 5-[(1',1',1'-trifluoro-2'-trifluoromethyl-2'-hydroxy)propyl]norbornane-2-yl and 20 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 20.1 g of white polymer was obtained.

The obtained polymer was analyzed by $^{13}$C, $^{1}$H-NMR and GPC measurement, and the following results were obtained.

Copolymerization ratio methacrylic acid-3-ethyl-3-exotetracyclo[4.4.0.1$^{2,5}$.1$^{7,10}$]dodecanyl:methacrylic acid-3-hydroxy-1-adamantyl:vinyl ether 5-[(1',1',1'-trifluoro-2'-trifluoromethyl-2'-hydroxy)propyl]norbornane-2-yl=0.33:0.49:0.18

Mass average-molecular-weight (Mw)=13,200
Molecular weight distribution (Mw/Mn)=1.93 polymer4

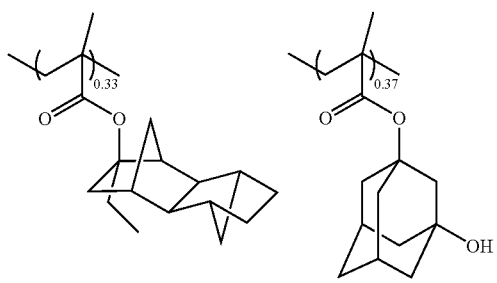

polymer5

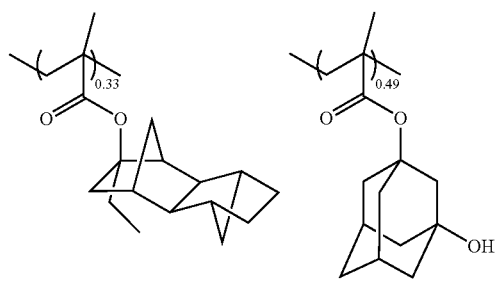

-continued

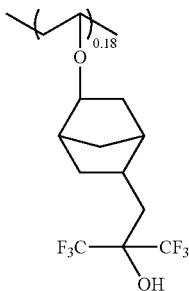

This polymer is defined as Polymer 5.

Synthetic Example 6

To 100 mL flask were added 9.5 g of methacrylic acid-3-ethyl-3-exotetracyclo[4.4.0.1$^{2,5}$.1$^{7,10}$]dodecanyl, 10.0 g of methacrylic acid 3-oxo-2,7-dioxa-tricyclo[4.2.1.0$^{4,8}$]-9-nonyl, 8.8 g of methacrylic acid 5-hydroxy-5-trifluoromethyl-bicyclo[2.2.1]hept-2-yl and 20 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 23.9 g of white polymer was obtained.

The obtained polymer was analyzed by $^{13}$C, $^1$H-NMR and GPC measurement, and the following results were obtained.
Copolymerization ratio methacrylic acid-3-ethyl-3-exotetracyclo[4.4.0.1$^{2,5}$.1$^{7,10}$]dodecanyl:methacrylic acid 3-oxo-2,7-dioxa-tricyclo[4.2.1.0$^{4,8}$]-9-nonyl:methacrylic acid 5-hydroxy-5-trifluoromethyl-bicyclo[2.2.1]hept-2-yl=0.35:0.32:0.33
Mass average-molecular-weight (Mw)=10,600
Molecular weight distribution (Mw/Mn)=1.8 polymer6

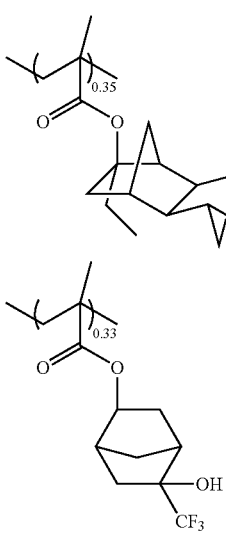

This polymer is defined as Polymer 6.

Synthetic Example 7

To 100 mL flask were added 9.5 g of methacrylic acid-3-ethyl-3-exotetracyclo[4.4.0.1$^{2,5}$.1$^{7,10}$]dodecanyl, 10.0 g of methacrylic acid 3-oxo-2,7-dioxatricyclo[4.2.1.0$^{4,8}$]-9-nonyl, 7.9 g of methacrylic acid 5-[3,3,3-trifluoro-2-methoxymethoxy-2-trifluoromethyl propyl]bicyclo[2.2.1]hept-2-yl and 20 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 21.3 g of white polymer was obtained.

The obtained polymer was analyzed by $^{13}$C, $^1$H-NMR and GPC measurement, and the following results were obtained.
Copolymerization ratio methacrylic acid-3-ethyl-3-exotetracyclo[4.4.0.1$^{2,5}$.1$^{7,10}$]dodecanyl:methacrylic acid 3-oxo-2,7-dioxatricyclo[4.2.1.0$^{4,8}$]-9-nonyl:methacrylic acid 5-[3,3,3-trifluoro-2-hydroxy-2-trifluoromethyl propyl]bicyclo[2.2.1]hept-2-yl=0.35:0.45:0.20
Mass average-molecular-weight (Mw)=9,800
Molecular weight distribution (Mw/Mn)=1.72 polymer7

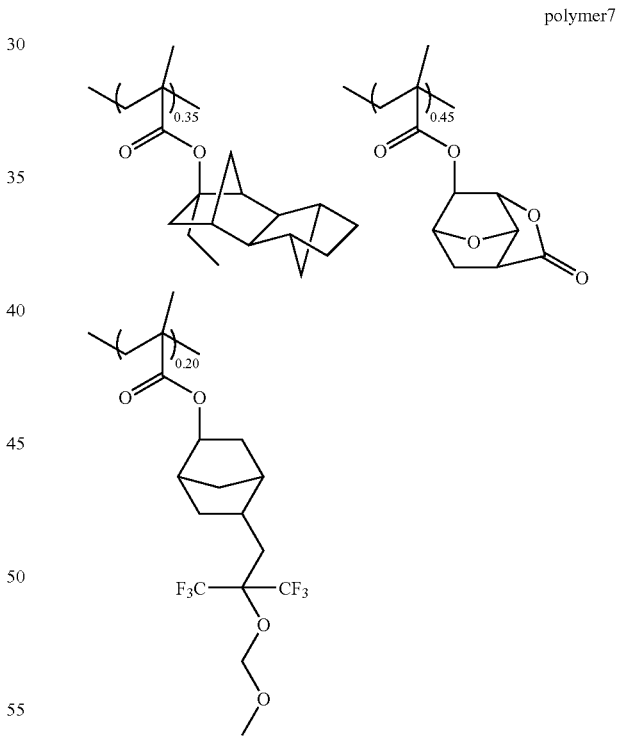

This polymer is defined as Polymer 7.

Synthetic Example 8

To 100 mL flask were added 9.5 g of methacrylic acid-3-ethyl-3-exotetracyclo[4.4.0.1$^{2,5}$.1$^{7,10}$]dodecanyl, 10.0 g of methacrylic acid 3-oxo-2,7-dioxatricyclo[4.2.1.0$^{4,8}$]-9-nonyl, 9.8 g of methacrylic acid 5-hydroxy-5-trifluoromethyl-6,6-difluoro-bicyclo[2.2.1]hept-2-yl and 20 g of tetrahydrofuran as a solvent. This vessel was cooled to −70° C.

under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 23.9 g of white polymer was obtained.

The obtained polymer was analyzed by $^{13}C$, $^{1}H$-NMR and GPC measurement, and the following results were obtained.

Copolymerization ratio methacrylic acid-3-ethyl-3-exotetracyclo[4.4.0.1$^{2,5}$.1$^{7,10}$]dodecanyl:methacrylic acid 3-oxo-2,7-dioxatricyclo[4.2.1.0$^{4,8}$]-9-nonyl:methacrylic acid 5-hydroxy-5-trifluoromethyl-6,6-difluoro-bicyclo[2.2.1]hept-2-yl=0.32:0.40:0.28

Mass average-molecular-weight (Mw)=10,800

Molecular weight distribution (Mw/Mn)=1.82

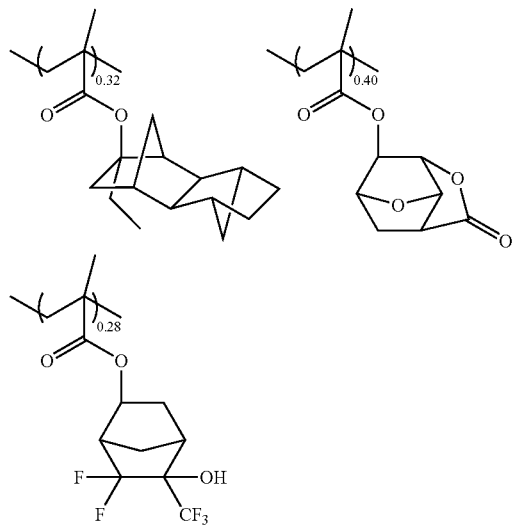

polymer8

This polymer is defined as Polymer 8.

Comparative Synthetic Example 1

To 100 mL flask were added 24.4 g of methacrylic acid-2-ethyl-2-adamantane, 17.1 g of methacrylic acid γ butyrolactone and 40 g of tetrahydrofuran as a solvent. This vessel was cooled to −70° C. under nitrogen atmosphere, and degasing under reduced pressure and nitrogen flowing were repeated 3 times. 0.2 g of AIBN was added as a polymerization initiator after elevating to a room temperature, and then it was elevated to 60° C. and reacted for 15 hours. This reaction solution was precipitated in 500 ml of isopropyl alcohol, the obtained white solid was taken by filtration and then dried under reduced pressure at 60° C., and 36.1 g of white polymer was obtained.

The obtained polymer was analyzed by $^{13}C$, $^{1}H$-NMR and GPC measurement, and the following results were obtained.

Copolymerization ratio Methacrylic acid-2-ethyl-2-adamantane:Methacrylic acid γ butyrolactone=0.48:0.52

Mass average-molecular-weight (Mw)=12500

Molecular weight distribution (Mw/Mn)=1.88

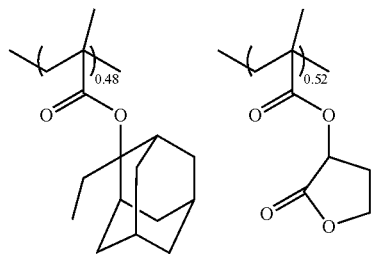

comparative polymer1

This polymer is referred to as Comparative polymer 1.

Examples, Comparative Example

[Preparation of Positive Resist Composition]

Using polymers synthesized above (Polymers 1–8 and Comparative polymer 1), the solution wherein the components were dissolved at composition shown in the following Table 1 was filtered through a 0.2 μm filter to prepare resist solutions.

Each composition in Table 1 is as follows.

Polymer 1–Polymer 8: obtained from Synthetic examples 1–8

Comparative Polymer 1: obtained from Comparative Example 1

Acid generator: PAG1, PAG2 (refer to the following structural formula)

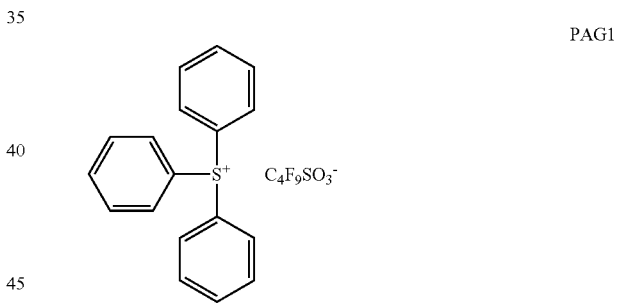

PAG1

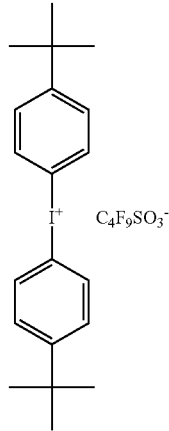

PAG2

Basic compound: tributyl amine, triethanolamine TMMEA, AAA, and AACN (refer to the following structural formula)

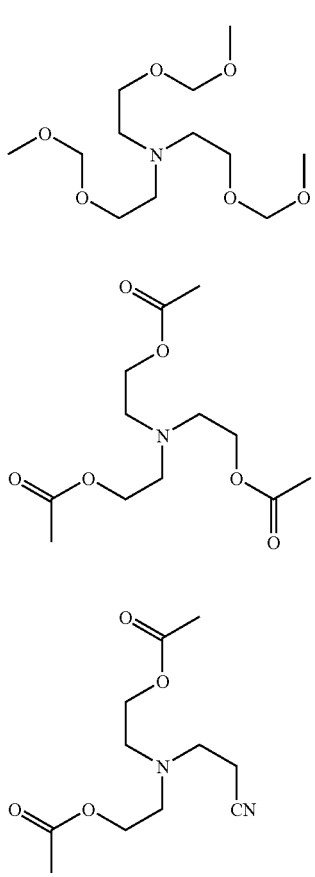

Dissolution inhibitor: DRI1 (refer to the following structural formula)

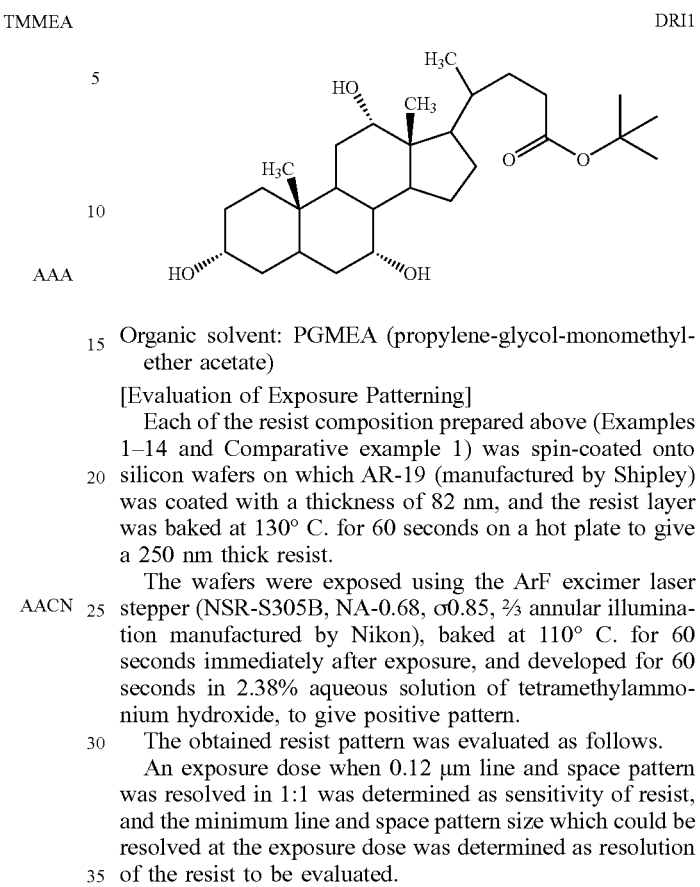

Organic solvent: PGMEA (propylene-glycol-monomethyl-ether acetate)

[Evaluation of Exposure Patterning]

Each of the resist composition prepared above (Examples 1–14 and Comparative example 1) was spin-coated onto silicon wafers on which AR-19 (manufactured by Shipley) was coated with a thickness of 82 nm, and the resist layer was baked at 130° C. for 60 seconds on a hot plate to give a 250 nm thick resist.

The wafers were exposed using the ArF excimer laser stepper (NSR-S305B, NA-0.68, σ0.85, 2/3 annular illumination manufactured by Nikon), baked at 110° C. for 60 seconds immediately after exposure, and developed for 60 seconds in 2.38% aqueous solution of tetramethylammonium hydroxide, to give positive pattern.

The obtained resist pattern was evaluated as follows.

An exposure dose when 0.12 μm line and space pattern was resolved in 1:1 was determined as sensitivity of resist, and the minimum line and space pattern size which could be resolved at the exposure dose was determined as resolution of the resist to be evaluated.

Moreover, line edge roughness of 0.12 μm line and space pattern was measured by the CD-SEM (S-9220 manufactured by Hitachi Seisakusho).

These results were shown together in Table 1.

| resist composition | polymer (parts by weight) | acid generator (parts by weight) | basic compounds (parts by weight) | dissolution inhibitor (parts by weight) | organic solvent (parts by weight) | sensitivity (mJ/cm$^2$) | resolution (um) | line edge roughness (3σ · nm) |
|---|---|---|---|---|---|---|---|---|
| example 1 | polymer 1 (100) | PAG 1 (2.2) | Tributyl amine (0.2) | — | PGMEA (800) | 23 | 0.11 | 7.6 |
| example 2 | polymer 2 (100) | PAG 1 (2.2) | Tributyl amine (0.2) | — | PGMEA (800) | 22 | 0.11 | 6.8 |
| example 3 | polymer 3 (100) | PAG 1 (2.2) | Tributyl amine (0.2) | — | PGMEA (800) | 24 | 0.11 | 7.2 |
| example 4 | polymer 4 (100) | PAG 1 (2.2) | Tributyl amine (0.2) | — | PGMEA (800) | 18 | 0.11 | 6.3 |
| example 5 | polymer 5 (100) | PAG 1 (2.2) | Tributyl amine (0.2) | — | PGMEA (800) | 28 | 0.11 | 6.9 |
| example 6 | polymer 6 (100) | PAG 1 (2.2) | Tributyl amine (0.2) | — | PGMEA (800) | 26 | 0.11 | 7.3 |
| example 7 | polymer 7 (100) | PAG 1 (2.2) | Tributyl amine (0.2) | — | PGMEA (800) | 28 | 0.105 | 6.8 |
| example 8 | polymer 3 (100) | PAG 2 (2.6) | Tributyl amine (0.2) | — | PGMEA (800) | 32 | 0.11 | 7.9 |

-continued

| resist composition | polymer (parts by weight) | acid generator (parts by weight) | basic compounds (parts by weight) | dissolution inhibitor (parts by weight) | organic solvent (parts by weight) | sensitivity (mJ/cm$^2$) | resolution (um) | line edge roughness (3σ · nm) |
|---|---|---|---|---|---|---|---|---|
| example 9 | polymer 2 (100) | PAG 1 (2.2) | Triethanol amine (0.25) | — | PGMEA (800) | 22 | 0.11 | 7.3 |
| example 10 | polymer 2 (100) | PAG 1 (2.2) | TMMEA (0.3) | — | PGMEA (800) | 26 | 0.10 | 7.2 |
| example 11 | polymer 2 (100) | PAG 1 (2.2) | AAA (0.3) | — | PGMEA (800) | 28 | 0.10 | 6.5 |
| example 12 | polymer 2 (100) | PAG 1 (2.2) | AACN (0.3) | — | PGMEA (800) | 29 | 0.10 | 6.3 |
| example 13 | polymer 2 (100) | PAG 1 (2.2) | Tributyl amine (0.2) | DR11 (20) | PGMEA (800) | 16 | 0.11 | 6.1 |
| example 14 | polymer 8 (100) | PAG 1 (2.2) | Tributyl amine (0.2) | — | PGMEA (800) | 30 | 0.11 | 7.6 |
| comparative example 1 | comparative polymer 1 (100) | PAG 1 (2.2) | Tributyl amine (0.2) | — | PGMEA (800) | 28 | 0.12 | 10.5 |

From Table 1, it is clear that the resist composition of Examples 1–14 has high sensitivity, high resolution and reduced line edge roughness.

[Evaluation of Dissolution Characterization in the Developer by the QCM Method]

The resist solution obtained by filtrating the solutions of the resist composition prepared above (Example 3, Comparative Example 1) with a 0.2 μm filter was spin-coated on a quartz board with a size of 1 inch (about 2.5 cm) wherein a chromic electrode was vapor-depositted on the surface of a ground made of gold, and the resist layer was baked at 130° C. for 60 seconds on a hot plate, to give 250 nm thick resist.

The substrate was exposed with the ArF exposure system ArFES3000 (manufactured by Litho Tech Japan), and PEB was performed at 110° C. for 60 seconds. The substrate was held in Quartz resonator micro balance equipment RDA-Qz3 (manufactured by Litho Tech Japan) for resist development analyzers, and the substrate was developed for 60 seconds in 2.38% aqueous solution of tetramethylammonium hydroxide, and swelling and dissolution during development were measured by the mode of oscillation AT cut. That is, the substrate was exposed with various exposure dose, and it was determined by QCM.

These results are shown in FIG. 1 and FIG. 2. In the drawings, when a film thickness increases as a development time runs it represents swelling of the resist, and when a film thickness decreases as a development time runs it represents dissolution of the resist.

FIG. 1 and FIG. 2 show that swelling measured by the QCM method during development is suppressed significantly in the resist composition of Example 3.

The present invention is not limited to the above-described embodiment. The above-described embodiments are some examples, and those having the substantially same composition as that described in the appended claims and providing the similar effects are included in the scope of the present invention.

What is claimed is:

1. A polymer, comprising:
   a repeating unit represented by the following general formula (1a), and
   any one of repeating units represented by the following formula (e-1), (e-2) and (e-3), and
   a repeating unit represented by a following general formula (1c-1),

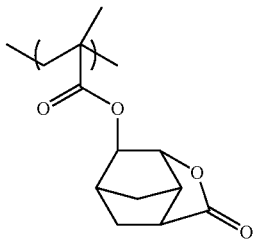

(e-1)

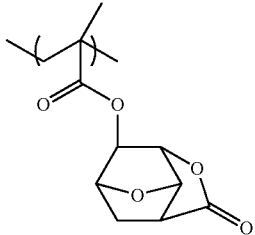

(e-2)

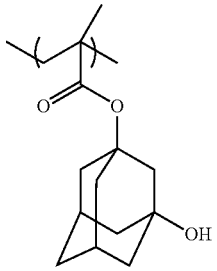

(e-3)

wherein $R^1$ represents a hydrogen atom, a methyl group or —$CH_2CO_2R^{14}$, $R^2$ represents a hydrogen atom, a methyl group or —$CO_2R^{14}$, $R^3$ represents a linear, branched or cyclic alkyl group having 1–8 carbon atoms or an aryl group having 6–20 carbon atoms which may be substituted, $R^4$ to $R^9$, $R^{12}$ and $R^{13}$ each independently represents a hydrogen atom or a monovalent hydrocarbon group having 1–15 carbon atoms which may contain a hetero atom, $R^{10}$ and $R^{11}$ represent a hydrogen atom, any one or more of $R^4$ and $R^5$, $R^6$ and $R^8$, $R^6$ and $R^9$, $R^7$ and $R^9$, $R^7$ and $R^{13}$, $R^8$ and $R^{12}$, $R^{10}$ and $R^{11}$, and $R^{11}$ and $R^{12}$ may form a ring together, in which case they represent a divalent hydrocarbon group having 1–15 carbon atoms which may contain a hetero atom, any one or more of $R^4$ and $R^{13}$, $R^{10}$ and $R^{13}$, and $R^6$ and $R^8$ which bond to adjacent carbon atoms may directly bond to each other to form a double bond, $R^{14}$ represents a hydrogen atom, a linear, branched or cyclic alkyl group having 1–15 carbon atoms, the general formula (1a) may represent an enantiomer, represents a hydrogen atom, a methyl group, or —$CH_2CO_2R^{14}$, $R^{24}$ represents a hydrogen atom, a methyl group, or —$CO_2R^{14}$, represents a single bond or a linear or branched alkylene group having 1–4 carbon atoms, $R^{25}$ represents a fluorine atom or trifluoromethyl group, $R^{26}$ represents a hydrogen atom or an acid labile group, $R^{29}$ and $R^{30}$ each represents a fluorine atom or a hydrogen atom, $X^1$ is any one of a single bond, a methylene group, an ethylene group, an oxygen atom, and a sulfur atom, represents —O— or —C(=O)—O—, and a and c fall within the range that $0.1 \leq a \leq 0.8$, and $0 < c \leq 0.8$.

2. A positive resist composition which comprises the polymer according to claim 1 as a base resin.

3. The positive resist composition according to claim 2 which further contains an organic solvent and an acid generator to serve as a chemically amplified resist composition.

4. The positive resist composition according to claim 3 which further contains a dissolution inhibitor.

5. The positive resist composition according to claim 4 which further contains a basic compound and/or a surfactant as an additive.

6. The positive resist composition according to claim 3 which further contains a basic compound and/or a surfactant as an additive.

7. The positive resist composition according to claim 2 which further contains a dissolution inhibitor.

8. The positive resist composition according to claim 7 which further contains a basic compound and/or a surfactant as an additive.

9. The positive resist composition according to claim 2 which further contains a basic compound and/or a surfactant as an additive.

10. A patterning process comprising, at least, a step of applying the resist composition according to claim 2 on a substrate, a step of exposing the applied resist composition to high energy beam after heat-treatment, and a step of developing the exposed resist composition by using a developer.

11. A patterning process according to claim 10 wherein the high energy beam has a wavelength of 180 nm–200 nm.

12. The polymer according to claim 1, further comprising a repeating unit represented by a following general formula (1b):

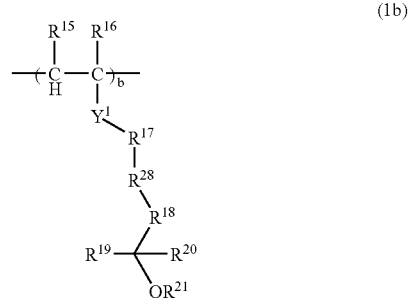

wherein:

$R^{16}$ represents a hydrogen atom, a methyl group, or —$CH_2CO_2R^{14}$, $R^{15}$ represents a hydrogen atom, a methyl group, or —$CO_2R^{14}$, $R^{17}$ represents a single bond or a linear or branched alkylene group having 1–4 carbon atoms, $R^{18}$ represents a single bond or a linear or branched alkylene group having 1–4 carbon atoms, $R^{19}$ and $R^{20}$ represent a trifluoromethyl group or a methyl group but that both of $R^{19}$ and $R^{20}$ cannot be a methyl group at the same time, $R^{21}$ represents a hydrogen atom or an acid labile group, $R^{28}$ represents a cyclic alkylene group having 4–20 carbon atoms, which may be a bridged cyclic alkylene group, and may contain an oxygen atom and/or a sulfur atom, $Y^1$ represents —O— or —C(=O)—O—, and b falls within the range that $0 < b \leq 0.8$ and $0.05 \leq b+c \leq 0.8$.

13. A positive resist composition which comprises the polymer according to claim 12 as a base resin.

14. The positive resist composition according to claim 13 which further contains an organic solvent and an acid generator to serve as a chemically amplified resist composition.

15. The positive resist composition according to claim 14 which further contains a dissolution inhibitor.

16. The positive resist composition according to claim 15 which further contains a basic compound and/or a surfactant as an additive.

17. The positive resist composition according to claim 14 which further contains a basic compound and/or a surfactant as an additive.

18. The positive resist composition according to claim 13 which further contains a dissolution inhibitor.

19. The positive resist composition according to claim 18 which further contains a basic compound and/or a surfactant as an additive.

20. The positive resist composition according to claim 13 which further contains a basic compound and/or a surfactant as an additive.

* * * * *